(12) United States Patent
Bao et al.

(10) Patent No.: US 8,866,265 B2
(45) Date of Patent: Oct. 21, 2014

(54) CARBON-BASED SEMICONDUCTORS

(71) Applicant: The Board of Trustees of the Leland Stanford Junior University, Palo Alto, CA (US)

(72) Inventors: Zhenan Bao, Stanford, CA (US); Marc Ramuz, La Bouilladisse (FR); Michael Vosgueritchian, Mountain View, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/573,726

(22) Filed: Oct. 3, 2012

(65) Prior Publication Data

US 2013/0082234 A1    Apr. 4, 2013

Related U.S. Application Data

(60) Provisional application No. 61/542,672, filed on Oct. 3, 2011.

(51) Int. Cl.
*H01L 29/12*   (2006.01)
*H01L 51/44*   (2006.01)
*H01L 51/42*   (2006.01)
*B82Y 30/00*   (2011.01)
*H01L 51/00*   (2006.01)

(52) U.S. Cl.
CPC ........... *H01L 51/424* (2013.01); *H01L 51/0048* (2013.01); *H01L 51/0046* (2013.01); *H01L 51/444* (2013.01); *Y02E 10/549* (2013.01); *B82Y 30/00* (2013.01)
USPC ........................................................ 257/613

(58) Field of Classification Search
CPC .............. H01L 29/161; H01L 29/7395; H01L 29/1608; H01L 21/0485; H01L 21/049; H01L 21/26506
USPC ...................... 257/77, E21.135, E29.084, 613
See application file for complete search history.

(56) References Cited

U.S. PATENT DOCUMENTS

| | | | |
|---|---|---|---|
| 5,264,376 A * | 11/1993 | Abbott et al. .................... 438/89 |
| 2006/0076050 A1* | 4/2006 | Williams et al. .............. 136/263 |
| 2006/0186502 A1* | 8/2006 | Shimotani et al. ............ 257/458 |
| 2009/0146111 A1* | 6/2009 | Shin et al. ...................... 252/510 |
| 2011/0204319 A1 | 8/2011 | Virkar et al. | |

(Continued)

OTHER PUBLICATIONS

Yang, Z.; Chen, T.; He, R.; Guan, G.; Li, H.; Qiu, L. and Peng, H., "Aligned Carbon Nanotube Sheets for the Electrode~ of Organic Solar Cells." Advanced Materials, 23, (45), 5436-5439, (2011).*

(Continued)

*Primary Examiner* — Yu-Hsi D Sun
*Assistant Examiner* — Christina Sylvia
(74) *Attorney, Agent, or Firm* — Crawford Maunu PLLC

(57) ABSTRACT

All-carbon-based semiconductor devices are provided. In accordance with an example embodiment, an apparatus includes n-type and p-type carbon-based semiconductor material that form a p-n junction, which are respectively coupled to electrodes having a carbon allotrope. A first one of electrodes is connected to the n-type material and a second one of the electrodes is connected to the p-type material, and collect charge presented at the p-n junction.

28 Claims, 17 Drawing Sheets

(56) References Cited

U.S. PATENT DOCUMENTS

| | | |
|---|---|---|
| 2011/0204330 A1 | 8/2011 | LeMieux et al. |
| 2011/0214723 A1* | 9/2011 | Kang et al. .................... 136/255 |
| 2011/0248401 A1 | 10/2011 | Hellstrom et al. |

OTHER PUBLICATIONS

Yanwu Zhu, Shanthi Murali, Weiwei Cai, Xuesong Li, Ji Won Suk, Jeffrey R. Potts, Rodney S. Ruoff., "Graphene and Graphene Oxide: Synthesis, Properties, and Applications" Advanced Materials, vol. 22, Issue 46, 5226, Article first published online: Dec. 9, 2010.*

P. Würfel, Physics of Solar Cells: From Principles to New Concepts, Wiley-WCH, Weinheim, 2005.*

V. C. Tung; J.-H. Huang; J. Kim; A. J. Smith; C.-W. Chu and J. Huang, "Towards Solution Processed All-carbon Solar Cells: A Perspective", Energy Environ. Sci., 5, 7810, 2012.

R. M. Jain; R. Howden; K. Turdy; S. Shimizu; A. J. Hilmer; T. P. McNicholas; K. K. Gleason and M. S. Strano, "Polymer-Free Near-Infrared Photovoltaics with Single Chirality (6,5) Semiconducting Carbon Nanotube Active Layers", Adv. Mater. DOI:10.1002/adma. 201202088, 2012.

D. J. Bindl; M.-Y. Wu; F. C. Prehn and M. S. Arnold, "Efficiently Harvesting Excitons from Electronic Type-Controlled Semiconducting Carbon Nanotube Films", Nano Lett. pp. 455-460, 2011.

M. S. Arnold; J. D. Zimmerman, C. K. Renshaw; X. Xu; R. R. Lunt; C. M. Austin and S. R. Forrest, "Broad Spectral Response Using Carbon Nanotube/Organic Semiconductor/C60 Photodetectors", Nano Letters, vol. 9, No. 9, pp. 3354-3358, 2009.

H. J. Jeong, H. D. Jeong, H. Y. Kim; J. S. Kim; S. Y Jeong; J. T. Han; D. S. Bang and G.-W. Lee, "All-Carbon Nanotube-Based Flexible Field-Emission Devices: From Cathode to Anode", Adv. Funct. Mater. 21, pp. 1526-1532, 2011.

Sariciftci, N. S.; Braun, D.; Zhang, C.; Srdanov, V. I.; Heeger, A. J.; Stucky, G. and Wudl, F., "Semiconducting polymer-buckministerfullerene heterojunctions: Diodes, photodiodes, and photovoltaic cells." Applied Physics Letters, 62, (6), 585-587, (1993).

Yu, G.; Gao, J.; Hummelen, J. C.; Wudl, F. and Heeger, A. J., "Polymer Photovoltaic Cells: Enhanced Efficiencies via a Network of Internal Donor-Acceptor Heterojunctions." Science, 270, (5243), 1789-1791, (1995).

Prato, M., "[60] Fullerene chemistry for materials science applications." Journal of Materials Chemistry, 7, (7), 1097-1109, (1997).

Kataura, H.; Kumazawa, Y.; Maniwa, Y.; Umezu, I.; Suzuki, S.; Ohtsuka, Y. and Achiba, Y., "Optical properties of single-wall carbon nanotubes." Synthetic Metals, 103, (1-3), 2555-2558, (1999).

Yu, M.-F.; Lourie, O.; Dyer, M. J.; Moloni, K.; Kelly, T. F. and Ruoff, R. S., "Strength and Breaking Mechanism of Multiwalled Carbon Nanotubes Under Tensile Load." Science, 287, (5453), 637-640, (2000).

Osman, M. A. and Srivastava, D., "Temperature Dependence of the Thermal Conductivity of Single-Wall Carbon Nanotubes." Nanotechnology, 12, (1), 21, (2001).

Baughman, R. H.; Zakhidov, A. A. and de Heer, W. A., "Carbon Nanotubes—the Route Toward Applications." Science, 297, (5582), 787-792, (2002).

Gao, W. Y. and Kahn, A., "Controlled p Doping of the Hole-Transport Molecular material N,N'-diphenyl-N,N'-bis(1-naphthyl)-1,1'-biphenyl-4,4'-diamine with Tetrafluorotetracyanoquinodimethane." Journal of Applied Physics, 94, 359, (2003).

Hartschuh, A.; Pedrosa, H. N.; Peterson, J.; Huang, L.; Anger, P.; Qian, H.; Meixner, A. J.; Steiner, M.; Novotny, L. and Krauss, T. D., "Single Carbon Nanotube Optical Spectroscopy." ChemPhysChem, 6, (4), 577-582, (2005).

Arnold, M. S. et al., "Sorting Carbon Nanotubes by Electronic Structure Using Density Differentiation." Nat Nano, 1, (1), 60-65, (2006).

Itkis, M. E. et al., "Bolometric Infrared Photoresponse of Suspended Single-Walled Carbon Nanotube Films," Science, 312, (5772), 413-416, (2006).

Scharber, M. C.; Mühlbacher, D.; Koppe, M.; Denk, P.; Waldauf, C.; Heeger, A. J. and Brabec, C. J., "Design Rules for Donors in Bulk-Heterojunction Solar Cells—Towards 10 % Energy-Conversion Efficiency." Advanced Materials, 18, (6), 789-794, (2006).

Rowell, M. W.; Topinka, M. A.; McGehee, M. D.; Prall, H.-J.; Dennler, G.; Sariciftci, N. S.; Hu, L. and Gruner, G., "Organic Solar Cells with Carbon Nanotube Network Electrodes." Applied Physics Letters, 88, (23), 233506, (2006).

Geng, J. and Zeng, T., "Influence of Single-Walled Carbon Nanotubes Induced Crystallinity Enhancement and Morphology Change on Polymer Photovoltaic Devices." Journal of the American Chemical Society, 128, (51), 16827-16833, (2006).

Li, C.; Chen, Y.; Wang, Y.; Iqbal, Z.; Chhowalla, M. and Mitra, S., "A Fullerene-Single Wall Carbon Nanotube Complex for Polymer Bulk Heterojunction Photovoltaic Cells." Journal of Materials Chemistry, 17, (23), 2406-2411, (2007).

Cognet, L.; Tsyboulski, D. A.; Rocha, J.-D. R.; Doyle, C. D.; Tour, J. M. and Weisman, R. B., "Stepwise Quenching of Exciton Fluorescence in Carbon Nanotubes by Single-Molecule Reactions." Science, 316, (5830), 1465-1468, (2007).

Geim, A. K. and Novoselov, K. S., "The Rise of Graphene." Nat Mater, 6, (3), 183-191, (2007).

Arranz-Andres, J. and Blau, W. J., "Enhanced Device Performance Using Different Carbon Nanotube Types in Polymer Photovoltaic Devices." Carbon, 46, (15), 2067-2075, (2008).

Lee, J.-Y.; Connor, S. T.; Cui, Y. and Peumans, P., "Solution-Processed Metal Nanowire Mesh Transparent Electrodes." Nano Letters, 8, (2), 689-692, (2008).

Lee, C.; Wei, X.; Kysar, J. W. and Hone, J., "Measurement of the Elastic Properties and Intrinsic Strength of Monolayer Graphene." Science, 321, (5887), 385-388, (2008).

Huang, J.: Li, G. and Yang, Y., "A Semi-transparent Plastic Solar Cell Fabricated by a Lamination Process." Advanced Materials, 20, (3), 415-419, (2008).

Becerril, H. A.; Mao, J.; Liu, Z.; Stoltenberg, R. M.; Bao, Z.; and Chen, Y., "Evaluation of Solution-Processed Reduced Graphene Oxide Films as Transparent Conductors." ACS Nano, 2, (3), 463-470, (2008).

Geim, A. K., "Graphene: Status and Prospects." Science, 324, (5934), 1530-1534, (2009).

Zhu, H.; Wei, J.; Wang, K. and Wu, D., "Applications of Carbon Materials in Photovoltaic Solar Cells." Solar Energy Materials and Solar Cells, 93, (9), 1461-1470, (2009).

Kuo, C. C. and Jackson, T. N., "Direct Lithographic Top Contacts for Pentacene Organic Thin-Film Transistors." Applied Physics Letters, 94, 053304, (2009).

Ji, Y.; Huang, Y. Y.; Tajbakhsh, A. R. and Terentjev, E. M., "Polysiloxane Surfactants for the Dispersion of Carbon Nanotubes in Non-Polar Organic Solvents." Langmuir, 25, 12325-12331., (2009).

Welch, G. C.; Coffin, R.; Peet, J. and Bazan, G. C., "Band Gap Control in Conjugated Oligomers Via Lewis Acids." Journal of the American Chemical Society,, 131, 10802-10804, (2009).

An, Z.; Odom, S. A.; Kelley, R. F.; Huang, C.; Zhang, X.; Barlow, S.; Padilha, L. A.; Fu, J.; Webster, S.; Hagan, D. J.; Van Stryland, E. W.; Wasielewski, M. R. and Marder, S. R., "Synthesis and Photophysical Properties of Donor- and Acceptor-Substituted 1,7-Bis(arylalkynyl)perylene-3,4:9,10-bis(dicarboximide)s." Journal of Physical Chemistry A, 113, 5585-5593, (2009).

Seo, J. H.; Gutacker, A.; Walker, B.; Cho, S. N.; Garcia, A.; Yang, R. Q.; Nguyen, T. Q.; Heeger, A. J. and Bazan, G. C., "Improved Injection in n-Type Organic Transistors with Conjugated Polyelectrolytes." Journal of the American Chemical Society, 131, 18220, (2009).

Kim, K. S.; Zhao, Y.; Jang, H.; Lee, S. Y.; Kim, J. M.; Kim, K. S.; Ahn, J.-H.; Kim, P.; Choi, J.-Y. and Hong, B. H., "Large-Scale Pattern Growth of Graphene Films for Stretchable Transparent Electrodes." Nature, 457, (7230), 706-710, (2009).

Wei, P.; Oh, J. H.; Dong, G. and Bao, Z., "Use of a 1H-Benzoimidazole Derivative as an n-Type Dopant and to Enable Air-Stable Solution-Processed n-Channel Organic Thin-Film Transistors." Journal of the American Chemical Society, 132, (26), 8852-8853, (2010).

(56) References Cited

OTHER PUBLICATIONS

Jang, S.; Jang, H.; Lee, Y.; Suh, D.; Baik, S.; Hong, B. H., and Ahn, J. H., "Flexible, Transparent Single-Walled Carbon Nanotube Transistors with Graphene Electrodes.". Nanotechnology, 21, (42), 425201. 22, (2010).

Wu, H.; Hu, L.; Rowell, M. W.; Kong, D.; Cha, J. J.; McDonough, J. R.; Zhu, J.; Yang, Y.; McGehee, M. D., and Cui, Y., "Electrospun Metal Nanofiber Webs as High-Performance Transparent Electrode." Nano Letters, 10, (10), 4242-4248, (2010).

Kim, J.; Cote, L. J.; Kim, F.; Yuan, W.; Shull, K. R. and Huang, J., "Graphene Oxide Sheets at Interfaces." Journal of the American Chemical Society, 132, (23), 8180-8186, (2010).

Li, S.-S.; Tu, K.-H.; Lin, C.-C.; Chen, C.-W., and Chhowalla, M., "Solution-Processable Graphene Oxide as an Efficient Hole Transport Layer in Polymer Solar Cells." ACS Nano, 4, (6), 3169-3174, (2010).

Gomez De Arco, L.; Zhang, Y.; Schlenker, C. W.; Ryu, K.; Thompson, M. E., and Zhou, C., "Continuous, Highly Flexible, and Transparent Graphene Films by Chemical Vapor Deposition for Organic Photovoltaics." ACS Nano, 4, (5), 2865-2873, (2010).

Lee, C. W.; Han, X.; Chen, F.; Wei, J.; Chen, Y.; Chan-Park, M. B., and Li, L.-J., "Solution-Processable Carbon Nanotubes for Semiconducting Thin-Film Transistor Devices." Advanced Materials, 22, (11), 1278-1282, (2010).

Lee, J-Y.; Connor, S. T.; Cui, Y. and Peumans, P., "Semitransparent Organic Photovoltaic Cells with Laminated Top Electrode." Nano Lett., 10, 1276-1279, (2010).

Hirsch, A., "The Era of Carbon Allotropes." Nat Mater, 9, (11), 868-871, (2010).

Dinadayalane, T. and Leszczynski, J., "Remarkable Diversity of Carbon—Carbon Bonds: Structures and Properties of Fullerenes, Carbon Nanotubes, and Graphene." Structural Chemistry, 21, (6), 1155-1169, (2010).

Lee, H. W. et al, "Selective Dispersion of High Purity Semiconducting Single-Walled Carbon Nanotubes with Regioregular Poly(3-alkylthiophene)s." Nature Communications, 2011.

Noorden, R. V., "Chemistry: The Trials of New Carbon." Nature, 469, 14-16, (2011).

Schnorr, J. M. and Swager, T. M., "Emerging Applications of Carbon Nanotubes" Chemistry of Materials, 23, (3), 646-657, (2011).

Yang, L.; Wang, S.; Zeng, Q.; Zhang, Z.; Pei, T.; Li, Y. and Peng, L.-M., "Efficient Photovoltage Multiplication in Carbon Nanotubes." Nat Photon, 5, (11), 672-676. 24, (2011).

Wan, X.; Long, G.; Huang, L. and Chen, Y., "Graphene—A Promising Material for Organic Photovoltaic Cells." Advanced Materials, 23, (45), 5342-5358, (2011).

Yang, Z.; Chen, T.; He, R.; Guan, G.; Li, H.; Qiu, L. and Peng, H., "Aligned Carbon Nanotube Sheets for the Electrodes of Organic Solar Cells." Advanced Materials, 23, (45), 5436-5439, (2011).

Ren, S.; Bernardi, M.; Lunt, R. R.; Bulovic, V.; Grossman, J. C. and Gradecak, S., "Toward Efficient Carbon Nanotube/P3HT Solar Cells: Active Layer Morphology, Electrical, and Optical Properties." Nano Letters, 11, (12), 5316-5321, (2011).

Jia, Y.; Cao, A.; Bai, X.; Li, Z.; Zhang, L.; Guo, N.; Wei, J.; Wang, K.; Zhu, H.; Wu, D. and Ajayan, P. M., "Achieving High Efficiency Silicon—Carbon Nanotube Heterojunction Solar Cells by Acid Doping." Nano Letters, 11, (5), 1901-1905, (2011).

Hecht, D. S.; Hu, L. and Irvin, G., "Emerging Transparent Electrodes Based on Thin Films of Carbon Nanotubes, Graphene, and Metallic Nanostructures." Advanced Materials, 23, (13), 1482-1513, (2011).

Lunt, R. and Vladimir, B., Transparent, Near-Infrared Organic Photovoltaic Solar Cells for Window and Energy-Scavenging Applications. Applied Physics Letters, 98, (11), 113305, (2011).

Hsu, C.-L.; Lin, C.-T.; Huang, J.-H.; Chu, C.-W.; Wei, K.-H. and Li, L.-J., "Layer-by-Layer Graphene/TCNQ Stacked Films as Conducting Anodes for Organic Solar Cells." ACS Nano, 6, (6), 5031-5039, (2012).

Kaltenbrunner, M.; White, M. S.; Glowacki, E. D.; Sekitani, T.; Someya, T.; Sariciftci, N. S. and Bauer, S., Ultrathin and Lightweight Organic Solar Cells with High Flexibility. Nat Commun, 3, 770, (2012).

Tung, V. C.; Huang, J.-H.; Kim, J.; Smith, A. J.; Chu, C.-W. and Huang, J., "Towards Solution Processed All-Carbon Solar Cells: A Perspective." Energy & Environmental Science, 5, (7), 7810-7818, (2012).

Lee, S.-K.; Jang, H. Y.; Jang, S.; Choi, E.; Hong, B. H.; Lee, J.; Park, S. and Ahn, J.-H., "All Graphene-Based Thin Film Transistors on Flexible Plastic Substrates." Nano Letters, 12, 3472-3476, (2012).

\* cited by examiner

CARBON-BASED SEMICONDUCTORS

RELATED DOCUMENTS

This patent document claims the benefit under 35 U.S.C. §119 of U.S. Provisional Patent Application Ser. No. 61/542,672 entitled "Carbon-based Solar Cell" and filed on Oct. 3, 2011; this patent document and the Appendix filed in the underlying provisional application, including the references cited therein, are fully incorporated herein by reference.

FEDERALLY-SPONSORED RESEARCH AND DEVELOPMENT

This invention was made with Government support under contract FA9550-12-1-01906 awarded by the Air Force Office for Scientific Research. The Government has certain rights in this invention.

FIELD

The present disclosure is directed to carbon-based semiconductors, and various related apparatuses and methods.

BACKGROUND

A variety of semiconductor devices use different types of materials to suit particular applications. However, various materials have been difficult to implement. For instance, various carbon-based devices use electrode materials that may exhibit undesirable characteristics or fail to meet ever-increasing performance, manufacturability or other needs. Active layers often require the use of materials that are difficult to manufacture and/or implement, and expensive. These and other aspects remain challenging for the manufacture and implementation of a variety of semiconductor devices.

SUMMARY

Aspects of the present disclosure relate generally to carbon-based semiconductor apparatuses and related methods, and to addressing challenges relating to the above.

In accordance with an example embodiment, an apparatus includes a carbon-based semiconductor material including n-type and p-type materials that form a p-n junction (acceptor/donor junction) configured and arranged to exhibit a photovoltaic effect, and first and second electrodes respectively including carbon allotropes and separated by the carbon-based semiconductor material. The first electrode is connected to the n-type material and the second electrode is connected to the p-type material, and the electrodes collect charges generated at the p-n junction.

Another example embodiment is directed to a photovoltaic apparatus having an anode with an ozone-plasma-treated reduced graphene oxide sheet, a cathode with n-doped carbon nanotubes, and a carbon-based semiconductor material separating the anode and cathode. The carbon-based semiconductor material includes an n-type material having n-type fullerene connected to the cathode, and a p-type material having p-type material including semiconducting carbon nanotubes connected to the anode. The n-type material and p-type material form a p-n junction that generates charge via a photovoltaic effect in response to light passed via one of the anode and cathode, and the anode and cathode collect the generated charge.

Another example embodiment is directed to a method as follows. A first electrode is formed including a carbon allotrope, a carbon-based semiconductor material bilayer (or heterojunction) is formed on the first electrode, and a second electrode including a carbon allotrope is formed on the bilayer. The bilayer includes n-type and p-type materials that form a p-n junction that exhibits a photovoltaic effect, with the n-type material being connected to the p-type material and the p-type material being on the first electrode. The second electrode is connected to the n-type material and operates with the first electrodes to collect charge generated at the p-n junction.

The above summary is not intended to describe each embodiment or every implementation of the present disclosure. The figures, detailed description and claims that follow more particularly exemplify various embodiments.

BRIEF DESCRIPTION OF THE DRAWINGS

Aspects of the present disclosure may be more completely understood in consideration of the detailed description of various embodiments of the present disclosure that follows in connection with the accompanying drawings, in which.

DETAILED DESCRIPTION

Figure 1:
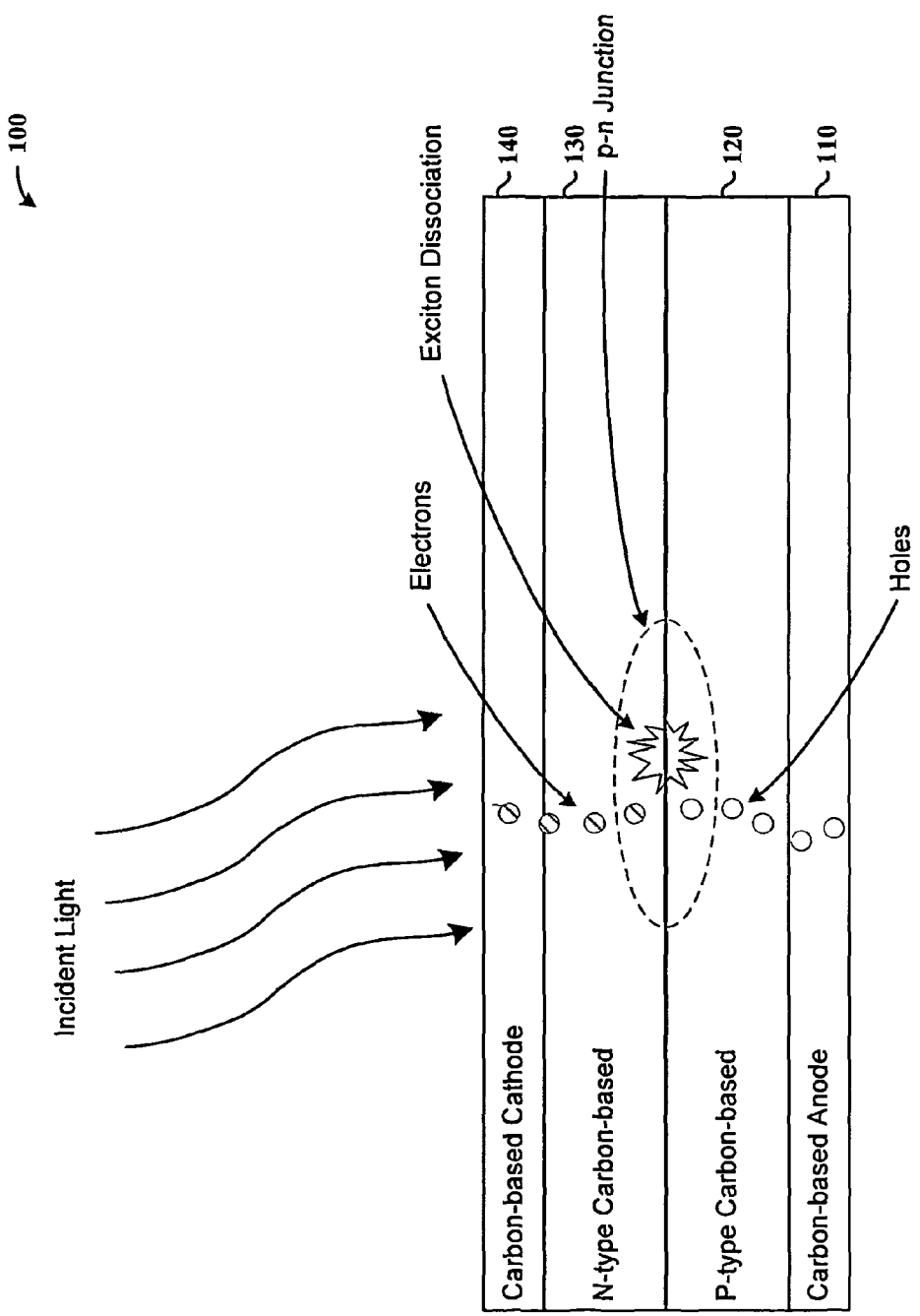
FIG. 1 shows a carbon-based semiconductor apparatus, in accordance with an example embodiment.

The present disclosure relates to carbon-based electrodes, such as may be implemented with carbon-based solar cells.

While the present disclosure is not necessarily limited to such devices and applications, various aspects of the disclosure may be appreciated through a discussion of examples using these and other contexts.

Various embodiments are directed to materials and processes for the fabrication of the all-carbon-based semiconductor devices, such as solar cells, transistors, flexible electronics, sensors and photodetectors (e.g., in which each component is carbon-based, or consists of a carbon-based material). In this context, all-carbon refers to semiconductor devices in which electrodes and active materials (e.g., the anode, active layer, and cathode of a solar cell) are all carbon-based. In accordance with one such embodiment, carbon-based semiconductor material is used as an active region between respective electrodes. The active region includes n-type and p-type materials that form a p-n junction (e.g., a donor acceptor junction). The electrodes each include a carbon allotrope, which may be different for each electrode, with the first electrode being connected to the n-type material and the second electrode being connected to the p-type material. The electrodes pass charge generated at the p-n junction. When implemented in photovoltaic applications, the resulting p-n junction generates charge by dissociating excitons generated at the p-n junction, in response to light incident upon the carbon-based semiconductor material.

The electrodes as discussed above and otherwise herein may include one or more of a variety of materials. In some embodiments, the electrode connected to the n-type material includes carbon nanotubes doped with an n-type dopant, and the electrode connected to the p-type material includes ozone-plasma-treated reduced graphene oxide. The first electrode may include one or more of carbon nanotubes, nanotubes doped with an n-type dopant, doped graphene or doped fullerene. The second electrode may include one or more of conductive carbon nanotubes (e.g., metallic nanotubes or a mixture thereof), p-doped nanotubes, graphene, and graphene oxide, such as a reduced graphene oxide sheet, or ozone-plasma-treated reduced graphene oxide (e.g., exhibiting work-function characteristics relative to the ozone treatment).

The carbon-based semiconductor material as discussed above and otherwise herein, is implemented with a variety of materials and approaches to suit particular embodiments. In some embodiments, the carbon-based material is arranged laterally between first and second electrodes (e.g., similar to FIG. 5). In other embodiments, the carbon-based material is stacked vertically between the first and second electrodes (e.g., similar to FIG. 1), where one of the electrodes passes light to the carbon-based semiconductor material for generating the charges. The n-type and p-type portions of the carbon-based material (bilayer) may include, for example, n-type C60 material and p-type semiconducting carbon nanotubes.

In some implementations, the carbon-based semiconductor material includes a plurality of single-walled carbon nanotubes including first and second types of nanotubes having different light absorption characteristics, with the first type of nanotubes absorbing more light energy than the second type of nanotubes under a first light condition, and the second type of nanotubes absorbing more light energy than the first type of nanotubes under a second light condition that is different than the first light condition. With this approach, the resulting device is amenable to desirable photovoltaic operation under differing light conditions.

In some embodiments, an all-carbon device includes respective anode and cathode terminals (electrodes) separated by a p-n junction, all of which are carbon-based. In some embodiments, the cathode electrode includes dopants (e.g., n-type, p-type) and carbon-based materials such as carbon nanotubes, graphene and fullerene derivatives such as C60-PCBM ([6,6]-phenyl-C61-butyric acid methyl ester), and can be carried out in a solution processed environment. In some implementations, one or both electrodes are manufactured with transparency characteristics (e.g., 80% or more), which can be tuned to suit particular embodiments (e.g., touch screens, solar cells) with a tradeoff between transparency and desired conductivity. In some embodiments, sorted semiconducting carbon nanotubes (e.g., HiPCO or arc-discharged carbon nanotubes) are used as the donor material for light absorption and charge generation, while C60 or C70 derivatives are used as the acceptor. For general information regarding transparency/conductivity aspects of related materials, and for specific information regarding such aspects as may be implemented in connection with one or more example embodiments, reference may be made to U.S. patent application Ser. Nos. 12/759,534; 13/011,352; and 13/011,402, which are fully incorporated herein by reference.

In connection with various embodiments herein, carbon atoms are arranged in different combinations to produce a wide variety of compounds that have respective physical, chemical, and electronic properties. Carbon allotropes (forms of carbon) such as fullerenes, carbon nanotubes (CNTs), and graphene are used in combination to fabricate devices composed completely of carbon-based components, with semiconducting materials used in active regions. In various embodiments, these materials are dispersed and deposited using solution processes, and in some implementations are integrated into tools and processes used for approaches such as roll-to-roll manufacturing. In accordance with various embodiments, electrical and/or optical of the respective carbon-based materials are tuned for use in different types of devices, such as transistors, solar cells, displays, and supercapacitors.

In a more particular embodiment, an active layer in an all-carbon device includes a bilayer film of a solution-sorted semiconducting SWNTs (as the light absorber and donor) and C60 (as the acceptor), on carbon-based electrodes. By controlling/optimizing the semiconducting SWNT dispersion and deposition conditions as well as the C60 thickness, desirable devices can be formed. Other example embodiments are directed to carbon-based electrode implementations, such as to replace existing electrodes in other processes. In one embodiment, an ITO anode is replaced with reduced graphene oxide (rGO) layers, and a metallic cathode is replaced with n-type doped SWNT films. With the use of these carbon based electrodes, all-carbon based devices such as photovoltaic devices, can be formed.

Various embodiments are directed to smoothing and/or enhancing conductivity or coupling of layers such as rGO and single-wall nanotubes to enhance the charge collection, device reproducibility, and contact with active layers. Contamination or residue left behind during the fabrication is limited. In some implementations, a SWNT cathode is formed on a semiconducting SWNT and C60 active bilayer without damaging the underlying active layer. Non-reflective characteristics of SWNTs are used to mitigate interference effects of transmitted light (e.g., relative to highly reflective metallic materials). In other implementations, the peak absorbance of the SWNT films are aligned with expected light conditions. For example, some applications are directed to devices having different types of SWNTs that absorb light differently under different light conditions, to facilitate peak/desirable absorbance under different light conditions using the different SWNTs. In many implementations, solar cells with a power conversion efficiency of greater than 0.44%, or greater than 1% are achieved.

Turning now to the figures, FIG. 1 shows a carbon-based semiconductor apparatus 100, in accordance with an example embodiment. The apparatus 100 includes a carbon-based anode 110, a bilayer active structure with a p-type carbon-based layer 120, an n-type carbon-based layer 130, and a carbon-based cathode 140. Responsive to incident light, the apparatus 100 operates to effect exciton dissociation at the p-n junction formed by layers 120 and 130. Hole carriers (shown as circles) flow between the anode 110 and the p-n junction, and electron carriers (holes with hashing) flow between the p-n junction and the cathode 140.

The p-type carbon-based layer 120 includes semiconducting carbon nanotubes (e.g., single-walled carbon nanotubes), and the n-type carbon-based layer 130 includes fullerene (C60). The semiconducting carbon nanotubes in layer 120 act as an absorbing and donor layer, and the fullerene acts as an acceptor layer. Excitons are generated at the p-n junction by the nanotubes in layer 120 after absorbing light mostly in the infrared (IR) region, and exciton dissociation occurs at the nanotube/fullerene interface. The electrons and holes are then transported to the cathode and anode, respectively, as shown.

In some instances, layer 120 includes semiconducting high-pressure carbon monoxide (HiPCO) SWNTs sorted using organic semiconducting polymer regioregular Poly(3-dodecylthiophene-2,5-diyl) (P3DDT). In some implementations, these semiconducting nanotubes are formed in such a manner that the layer 120 is about free of metallic SWNTs. A residue amount of P3DDT may be present in the film 120. For general information regarding sorting approaches, and for specific information regarding sorting approaches that may be used in connection with one or more embodiments herein, reference may be made to Lee, H. W., et al., "*Selective dispersion of high purity semiconducting single-walled carbon nanotubes with regioregular poly(3-alkylthiophene)s,*" Nat Commun 2011, 2, 541, which is fully incorporated herein by reference.

In some implementations, the active layer thickness is adjusted/optimized (e.g., with such a surface including semiconducting sorted SWNTs wrapped by P3DDT and a C60 layer), using carbon electrodes (e.g., rGO for the anode 110 and n-type doped SWNTs as the cathode 140). This approach can be effected with relatively small degradation to sun performance with respect to transparency/transmittance of the electrodes. For the active layers 120 and 130, absorption can be increased by introducing semiconducting single-walled nanotubes (SWNTs) that absorb in a broader range of the solar spectrum. In one example, larger diameter tubes such as those grown by the arc-discharge method are used to enhance the amount of absorption, especially between 900-1200 nm. In another example, the device structure of the randomly aligned SWNT layer 120 is changed to a unidirectionally aligned structure in which individual SWNTs directly bridge the electrodes is used to reduce exciton trapping by tube-to-tube junctions and increase exciton diffusion length in the system. For general information regarding photovoltaic devices, and for specific information regarding aspects of such devices for which one or more embodiments herein may be applicable, reference may be made to Jain, R. M., et al., "*Polymer-Free Near-Infrared Photovoltaics with Single Chirality (6,5) Semiconducting Carbon Nanotube Active Layers,*" Advanced Materials 2012, 24, (32), 4436-4439, which is fully incorporated herein by reference.

By way of example, the apparatus 100 is shown operable as a photovoltaic cell, as discussed above, with the p-n junction operable responsive to photovoltaic effect. However, various embodiments are directed to carbon-based semiconductor devices, using carbon-based active layers and electrodes as shown in FIG. 1. For example, an additional n-type or p-type active layer can be used to form a p-n-p or an n-p-n device, such as a transistor, between the respective electrodes. In some implementations, one or more additional electrodes can be implemented to perform a gating function in the active layers.

Figure 2:
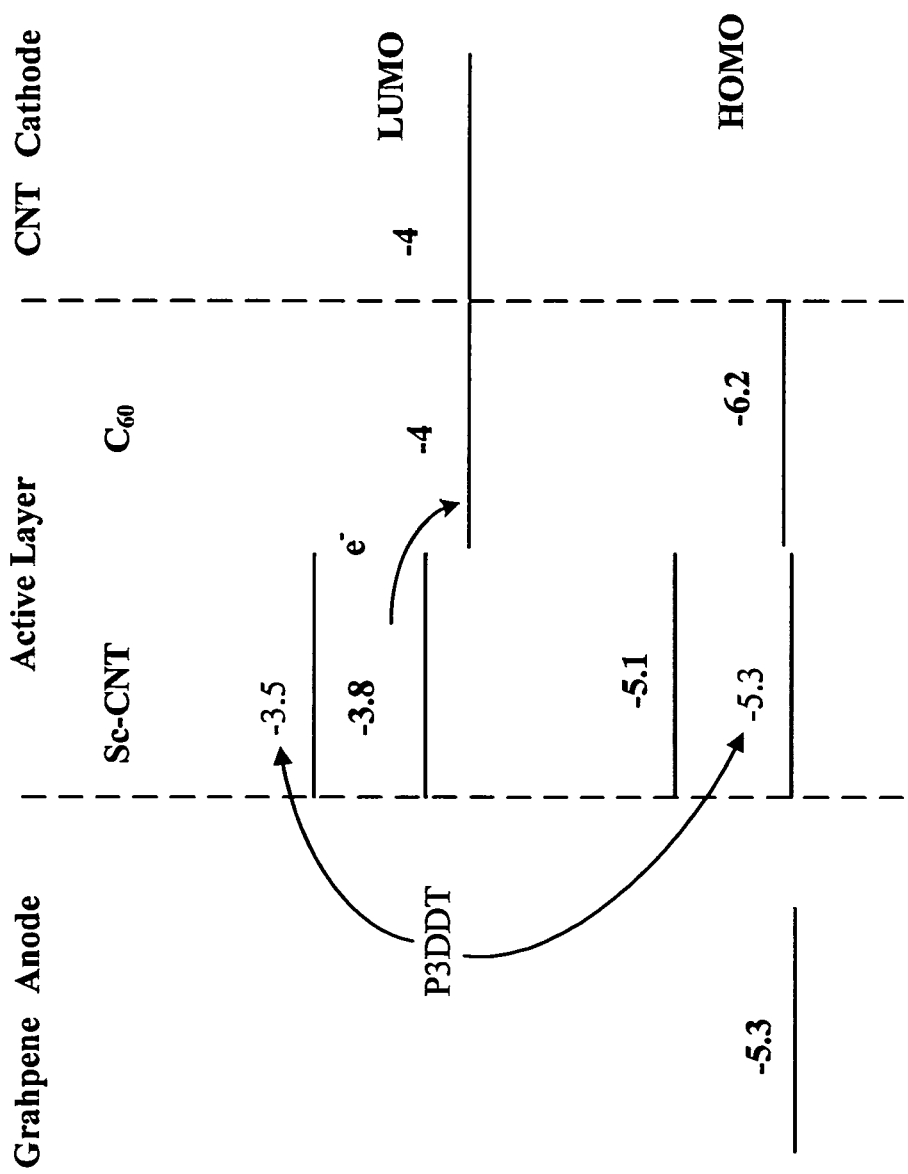
FIG. 2 shows respective energy levels for a carbon-based photovoltaic cell, in accordance with another example embodiment.

FIG. 2 shows respective energy levels (band diagrams) for a carbon-based photovoltaic cell, in accordance with another example embodiment. These energy levels may be implemented, for example, in connection with a device such as the apparatus 100 shown in FIG. 1, with a graphene anode, active layer and carbon nanotube (CNT) cathode, with the active layer including a bilayer of semiconducting carbon nanotubes and a layer of fullerene (C60). Respective lowest unoccupied molecular orbital (LUMO) and highest occupied molecular orbital (HOMO) levels are shown, as applicable to the respective active layers.

Figure 3:
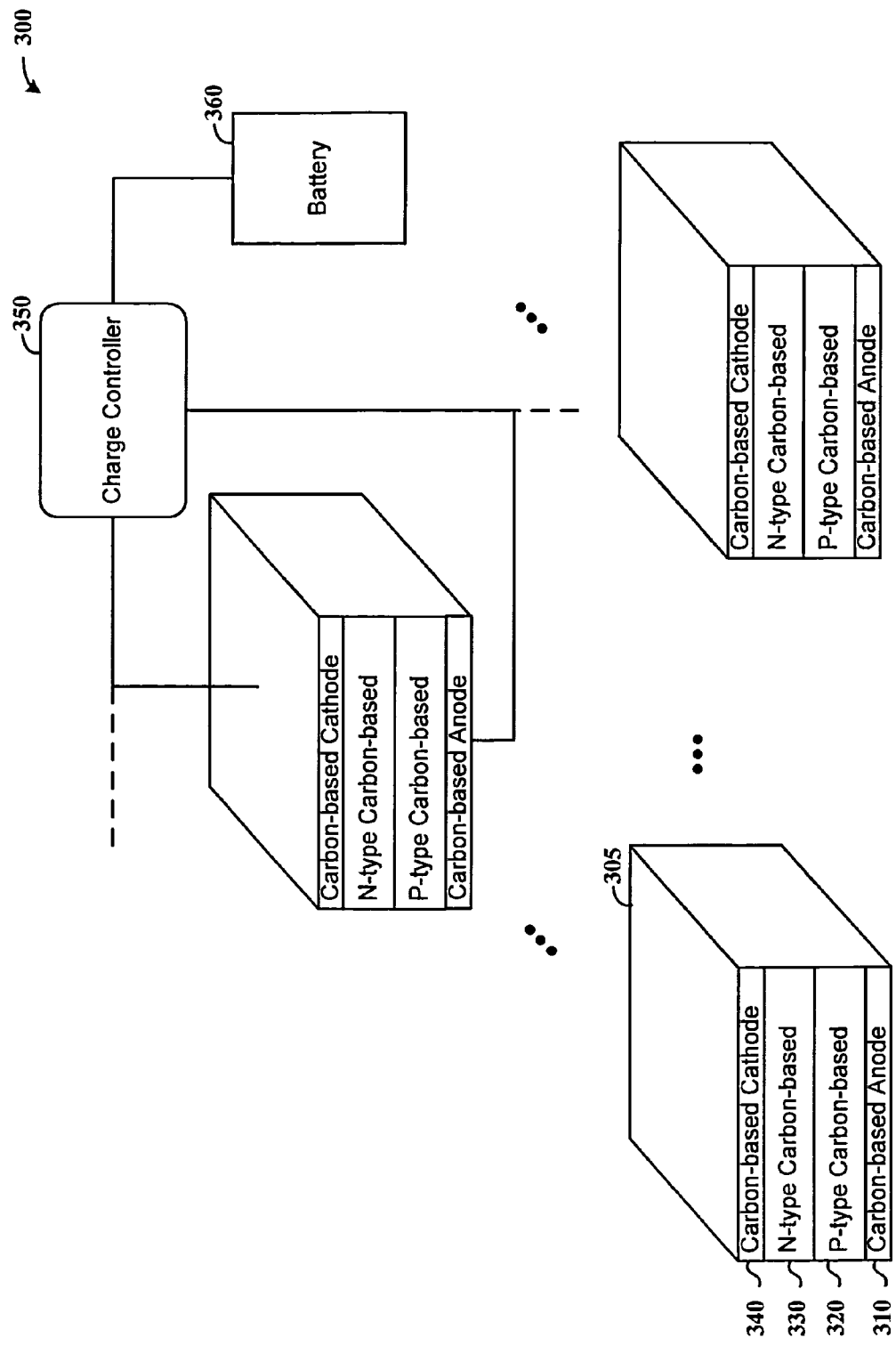
FIG. 3 shows a solar cell apparatus having a plurality of carbon-based photovoltaic cells, in accordance with another example embodiment.

FIG. 3 shows a solar cell apparatus 300 having a plurality of carbon-based photovoltaic cells, in accordance with another example embodiment. The photovoltaic cells each have an all-carbon structure of an anode and a cathode separated by a bilayer active material. Cell 305 is labeled by way of example and, similar to the apparatus 100 in FIG. 1, has an anode 310, p-type layer 320, n-type layer 330 and cathode 340. The cells are each coupled to a charge controller 350, which collects charge accumulated in each cell via photovoltaic effect, and presents the charge to power/charge a battery 360.

Figure 4:
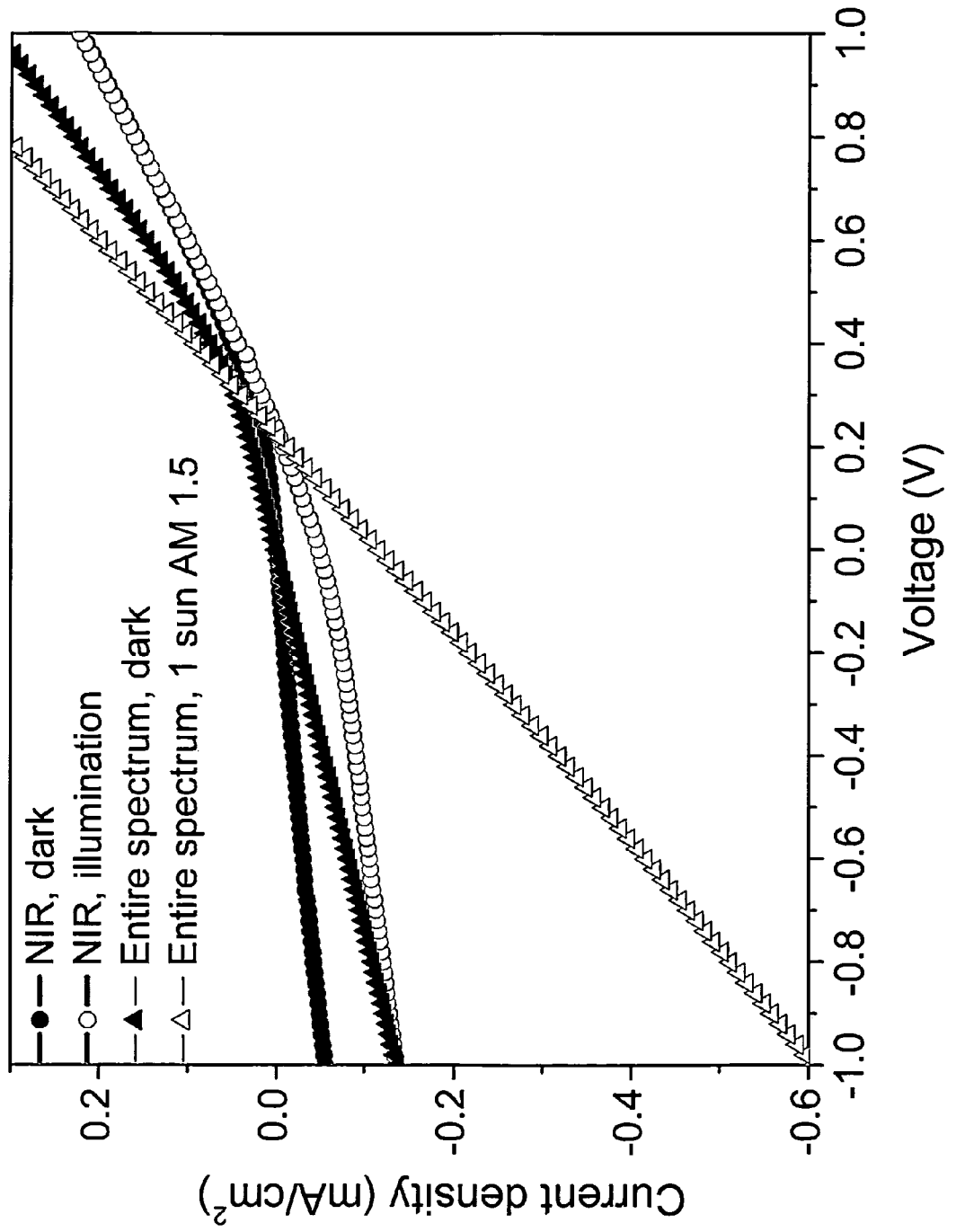
FIG. 4 shows plots of current density and voltage for a carbon-based photovoltaic cell, in accordance with another example embodiment.

FIG. 4 shows plots of current density and voltage for a carbon-based photovoltaic cell, in accordance with another example embodiment. These plots may be representative, for example, of an implementation of the apparatus 100 in FIG. 1, with an rGO anode, an active bilayer including a 5 nm thick layer of sorted semiconducting SWNTs and a 130 nm layer of fullerene C60, and n-type doped SWNT cathode (e.g., having an area of about 0.015 cm$^2$). Such devices may be implemented with a power conversion efficiency (PCE) of $7.4 \times 10^{-3}$% and $6.6 \times 10^{-3}$%, under near-IR and standard AM 1.5 illuminations.

Figure 5:
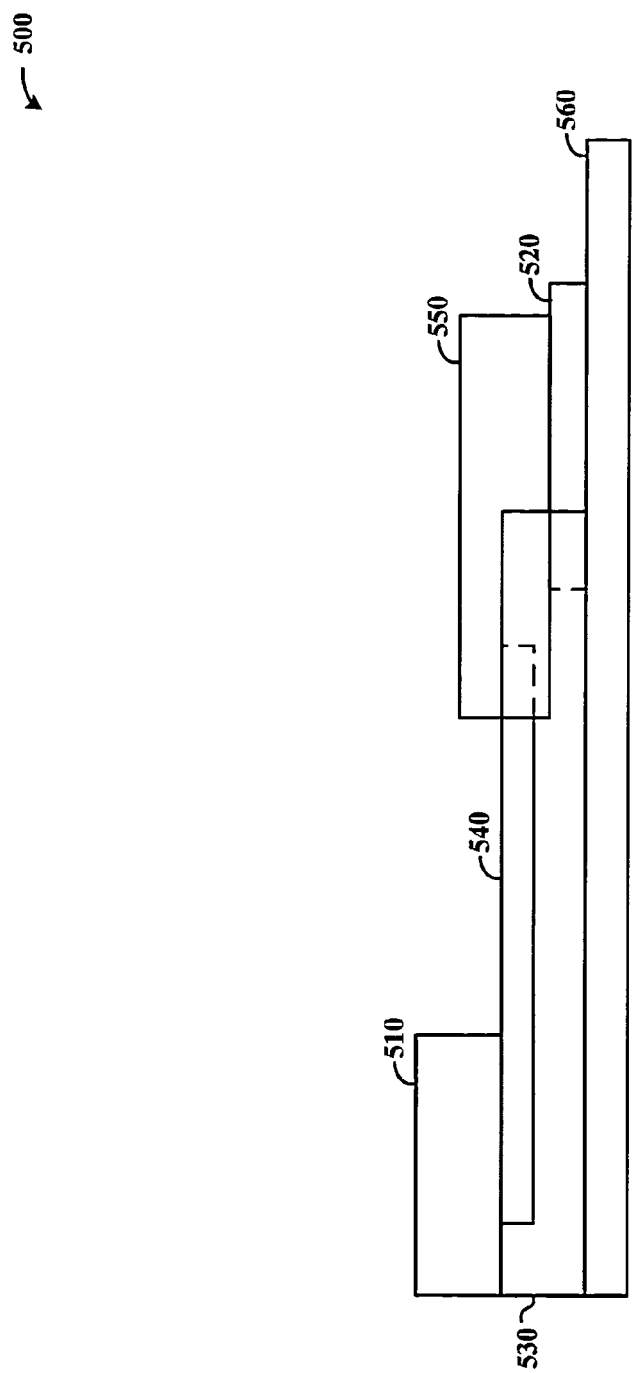
FIG. 5 shows a carbon-based photovoltaic apparatus, in accordance with another example embodiment.

FIG. 5 shows a carbon-based photovoltaic cell 500, in accordance with another example embodiment. The cell 500 includes a carbon cathode 510 and carbon anode 520 coupled via an active region including a fullerene-type material 530 (e.g., PCBM or C60/C70 derivatives) and semiconducting SWNTs 540. An insulator 550 is located over the carbon-based anode 520, and the device is on a glass substrate 560. The cell 500 may, for example, be implemented in an array-type form, similar to that shown in FIG. 3, with additional circuits (e.g., charge controller, battery).

Figure 6:
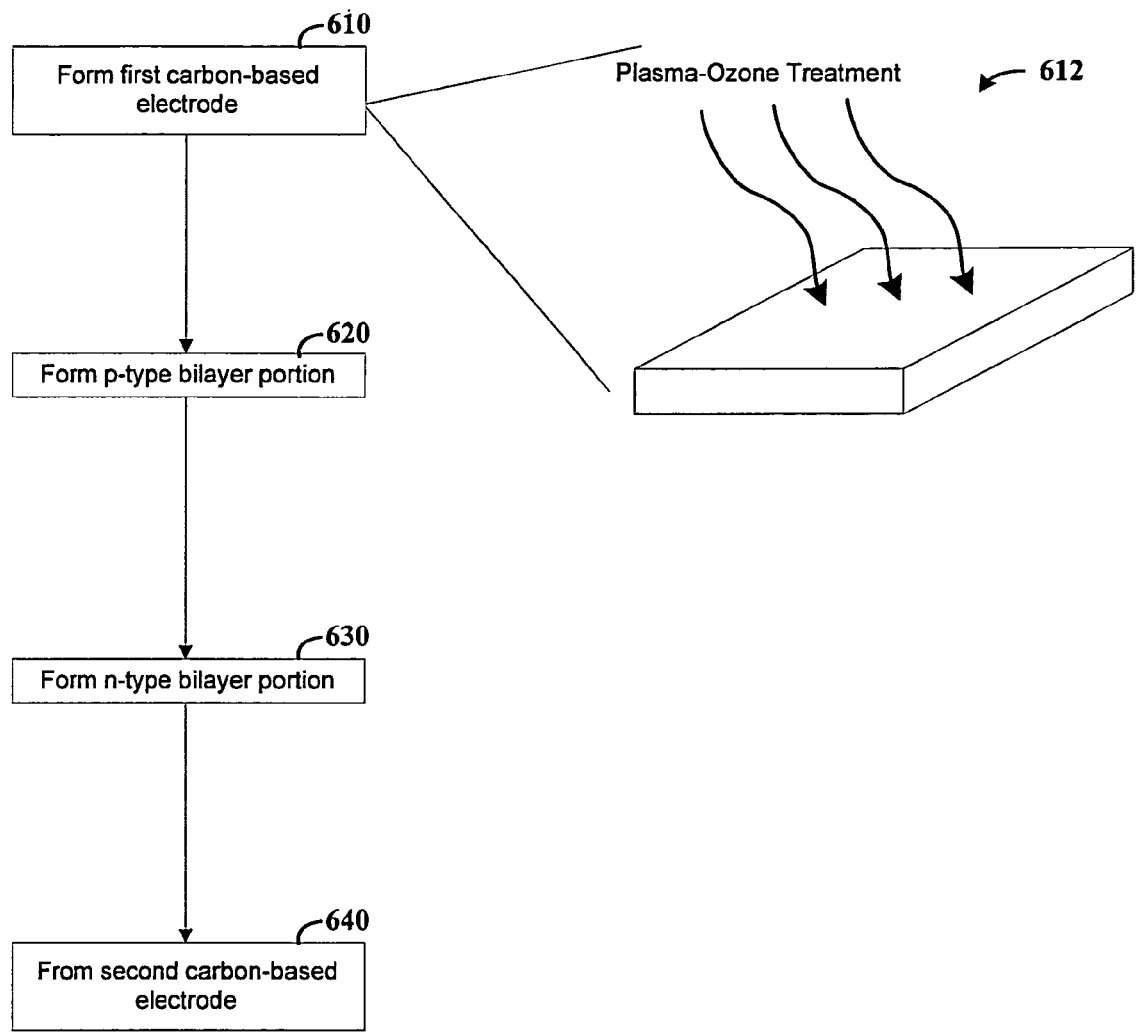
FIG. 6 is a flow diagram for manufacturing a carbon-based photovoltaic cell, in accordance with another example embodiment.

FIG. 6 is a flow diagram for manufacturing a carbon-based photovoltaic cell, in accordance with another example embodiment. At block 610, a first electrode having a carbon allotrope is formed, and a first portion of a carbon-based semiconductor material bilayer is formed on the first electrode at block 620 as a p-type carbon-based semiconductor layer. At block 630, a second portion of the carbon-based semiconductor material bilayer is formed on the first layer, as an n-type carbon-based semiconductor layer. The resulting carbon-based semiconductor material bilayer includes n-type (620) and p-type (630) materials that form a p-n junction that exhibits a photovoltaic effect.

At block 640, a second electrode including a carbon allotrope is formed and connected to the p-type material formed at block 630. The respective electrodes formed at blocks 610 and 640 operate to pass charge generated at the p-n junction within the bilayer portions formed at blocks 620 and 630. For instance, in embodiments in which the second electrode formed at block 640 has transparency characteristics, light passed through the second electrode and reading the p-n junction formed at blocks 620 and 630 generates an exciton with respective hole and electron charge carriers being presented to the respective first and second electrodes. In some implementations, one or both electrodes include carbon nanotubes, such as doped carbon nanotubes spray-coated and doped to the n-type or p-type polarity.

Several approaches may be used to form the respective layers at blocks 610-640. In some embodiments, the first electrode is formed at block 610 by treating a reduced graphene oxide sheet with ozone-plasma, as shown at 612. This treatment is carried out to set work-function characteristics of the electrode, as applicable to the passing of the carriers and resulting presentation of charge to a load coupled to the electrodes (e.g., for solar-cell applications in which a device is powered or a battery is charged). In some implementations, the ozone-plasma treatment is carried out for short periods of time, or pulses, with intermittent periods between the pulses in which the treatment is not effected. These ozone-treatment approaches can be effected to increase the work-function of the reduced graphene oxide sheet, such as related to its ability to collect and pass charge generated at the p-n junction. These approaches, such as may be carried out with devices shown in other figures, may be implemented to achieve a work-function increase of 5%, 8% or more, relative to such a reduced graphene oxide sheet not exhibiting ozone-plasma-treatment characteristics.

In some embodiments, the p-type carbon-based semiconductor layer formed at block 620 is formed by forming and p-doping semiconducting carbon nanotubes on the first electrode formed at block 610. The n-type carbon-based semiconductor layer is formed at block 630 by forming n-type fullerene on the p-type material to form the p-n junction. In certain embodiments, one or both of the p-type and n-type layers formed at block 620 and 630 are formed using first and second types of nanotubes having different light absorption characteristics. The first type of nanotubes absorbs more light energy than the second type of nanotubes under a first light condition, and the second type of nanotubes absorbs more light energy than the first type of nanotubes under a second light condition that is different than the first light condition.

Deposited SWNT films show high absorption in the IR region, up to 1500 nm. In some embodiments, these films may be used as IR absorbers for PVs, and used to complement other PV materials that absorb poorly in the IR regime. For general information regarding use of SWNTs for near-IR photodetectors, and for specific examples as may be implemented in connection with one or more embodiments, reference may be made to Bindl, D. J. et al., "*Efficiently Harvesting Excitons from Electronic Type-Controlled Semiconducting Carbon Nanotube Films,*" Nano Letters 2011, 11, (2), 455-460; Arnold, M. S. et al., "*Sorting carbon nanotubes by electronic structure using density differentiation,*" Nat Nano 2006, 1, (1), 60-65; and Itkis, M. E. et al., "*Bolometric Infrared Photoresponse of Suspended Single-Walled Carbon Nanotube Films,*" Science 2006, 312, (5772), 413-416, which are fully incorporated herein by reference. The absorption range of SWNTs is highly dependent on the type (diameter and chirality) of the SWNTs. In some embodiments, a broader range of different types of semiconducting SWNTs are used to further increase the absorption range of these devices, and the resulting efficiency. The efficiency achieved may vary depending on the source of light. For instance, the peak absorbance of the SWNT films may overlap better with the sun spectrum than with the peaks in the light output of a solar simulator, which may limit the absorption of the SWNT layer.

Figure 7:
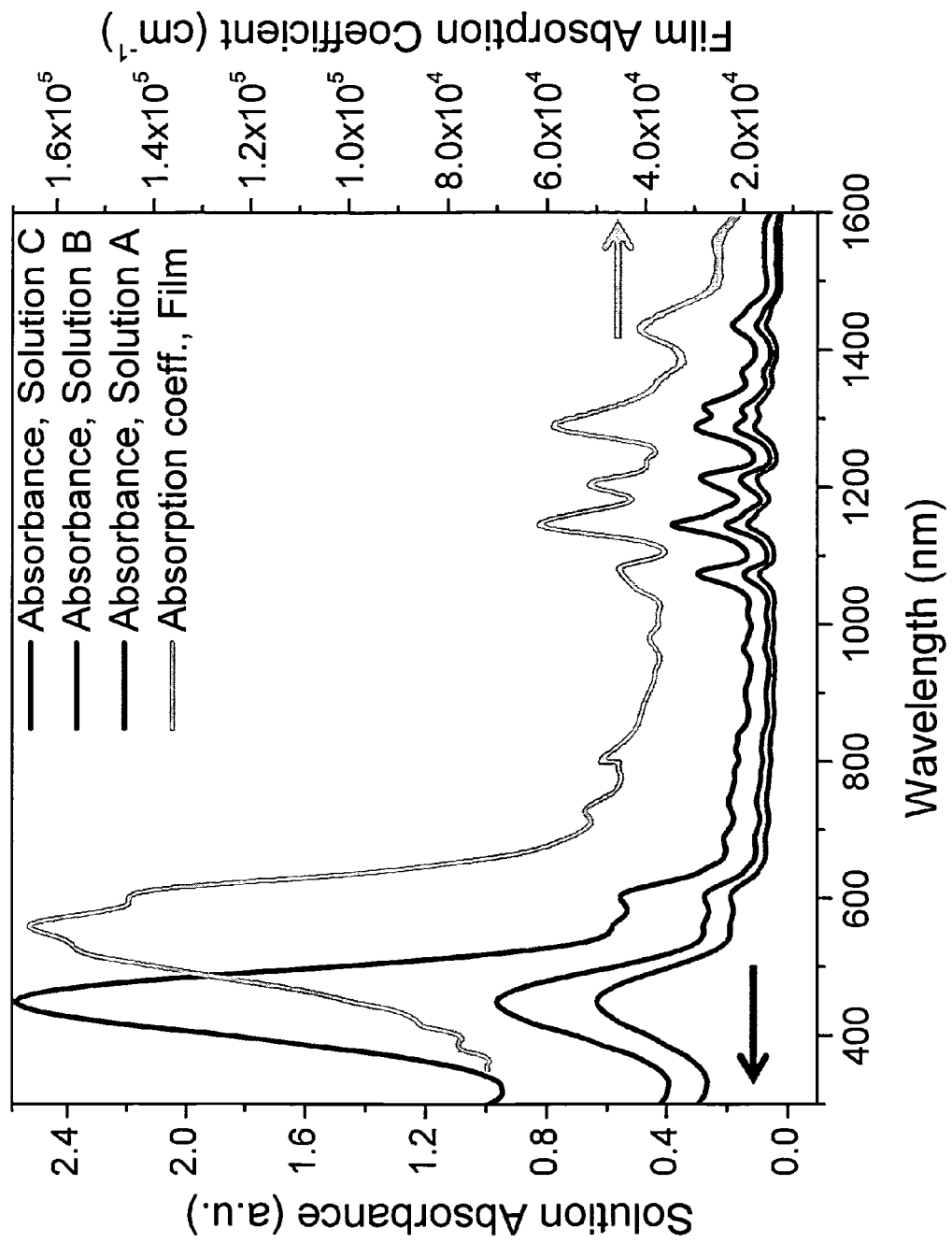
FIG. 7 shows plots of absorbance spectra and absorption coefficient at different wavelengths for single-walled nanotube (SWNT) wrapped by different concentrations of P3DDT, in accordance with one or more embodiments.
Figure 8:
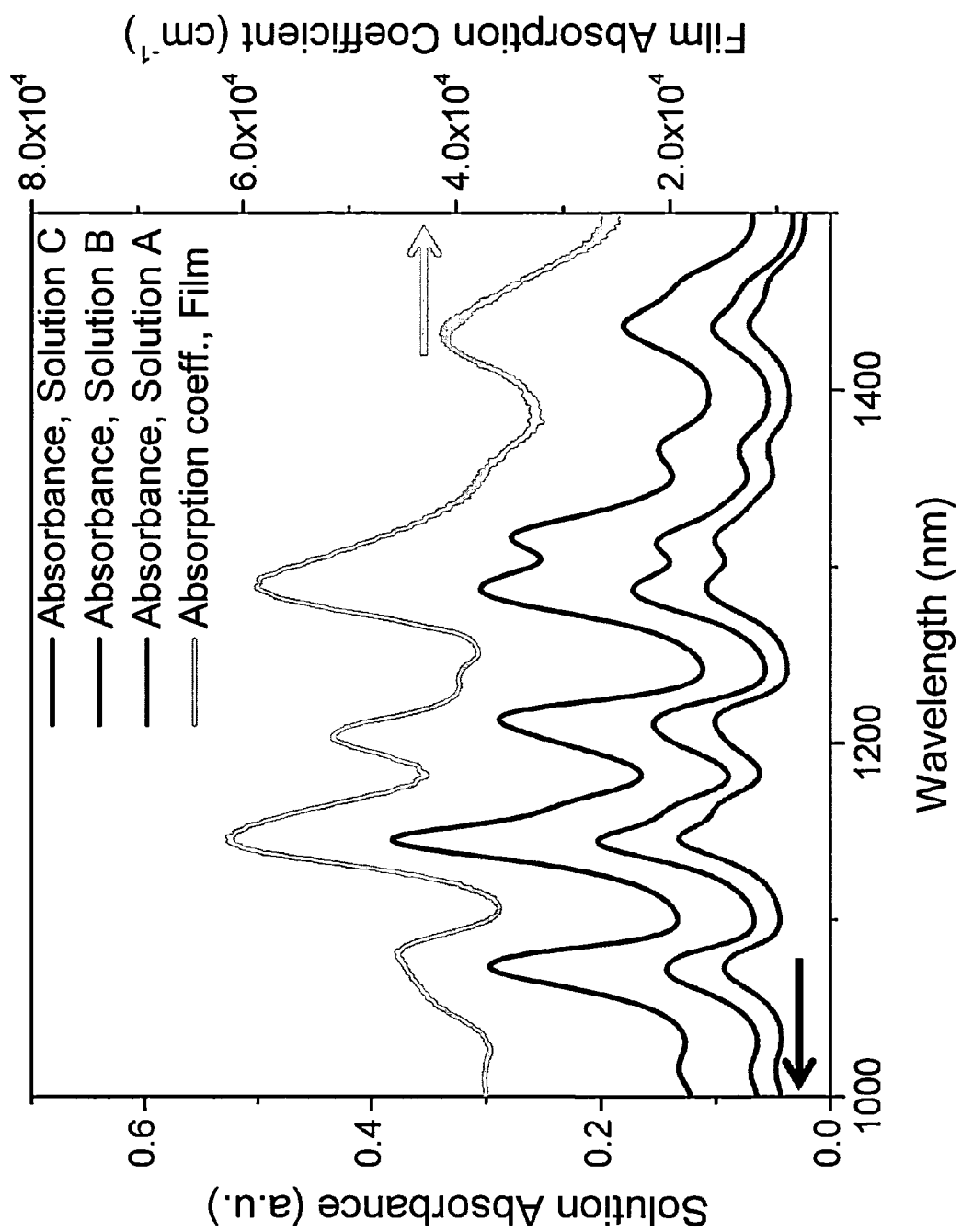
FIG. 8 shows plots of absorbance spectra and absorption coefficient at different wavelengths for SWNT wrapped by P3DDT, in accordance with one or more embodiments.

The absorbance of the SWNT layer may vary for different concentrations of the P3DDT sorted SWNT dispersions. FIGS. 7 and 8 show plots of absorbance spectra and absorption coefficient as a function of wavelength for SWNT wrapped by different concentrations of P3DDT. In this example, different concentrations of the P3DDT sorted SWNT dispersions were prepared to obtain different SWNT thicknesses while keeping the P3DDT:SWNT weight ratio the same at 1:1. The plots in FIGS. 7 and 8 show the absorbance spectra for devices made with solutions of 10 (solution A), 20 (solution B), and 30 mg (solution C) each of P3DDT and SWNT sonicated in 25 ml toluene followed by centrifugation to remove un-dispersed SWNTs. The plots also shows absorbance coefficient of a SWNT film made by spray coating solution B onto a glass substrate.

FIG. 7 shows the plots of absorbance spectra and absorption coefficient in the spectral range of 300-1600 nm, and FIG. 8 shows the plots of absorbance spectra and absorption coefficient in the spectral range of 1000-1500, as may be implemented in connection with one or more example embodiments. As shown in FIG. 7, the absorption peak in the 350-650 nm range is from the P3DDT, and the smaller peaks in the 1050-1500 nm range are from SWNTs. Each peak corresponds to a different SWNT chirality. For general information regarding analysis of the chirality, and for specific examples as may be performed in connection with one or more embodiments, reference may be made to Lee, H. W. et al., "*Selective dispersion of high purity semiconducting single-walled carbon nanotubes with regioregular poly(3-alkylthiophene)s,*" Nat. Commun. 2011, 2, 541, which is fully incorporated herein by reference. In this example, the majority of the SWNTs are (12,1), (10,5), (8,6), (9,4), and (9,5).

As shown in FIG. 8, in this example, nanotube peak absorption coefficient for the spray-coated solution B on glass substrate was measured to be $6 \times 10^4$ cm$^{-1}$. This is lower than that of P3DDT absorbance in the same film in the visible range ($1.6 \times 10^5$ cm$^{-1}$) but is remarkable for the near-IR range compared to typical organic solar cell materials, which normally do not absorb much in the near-IR. Moreover, by increasing the SWNT density, higher absorption coefficients are achieved. The absorption peaks in the 400-600 nm region are from the P3DDT polymer. In general, the P3DDT solution has a single absorption peak at about 450 nm; however, an additional peak is observed when it is dispersed with the SWNTs at about 600 nm, which has been attributed to the polymer/SWNT interaction.

Figure 9:
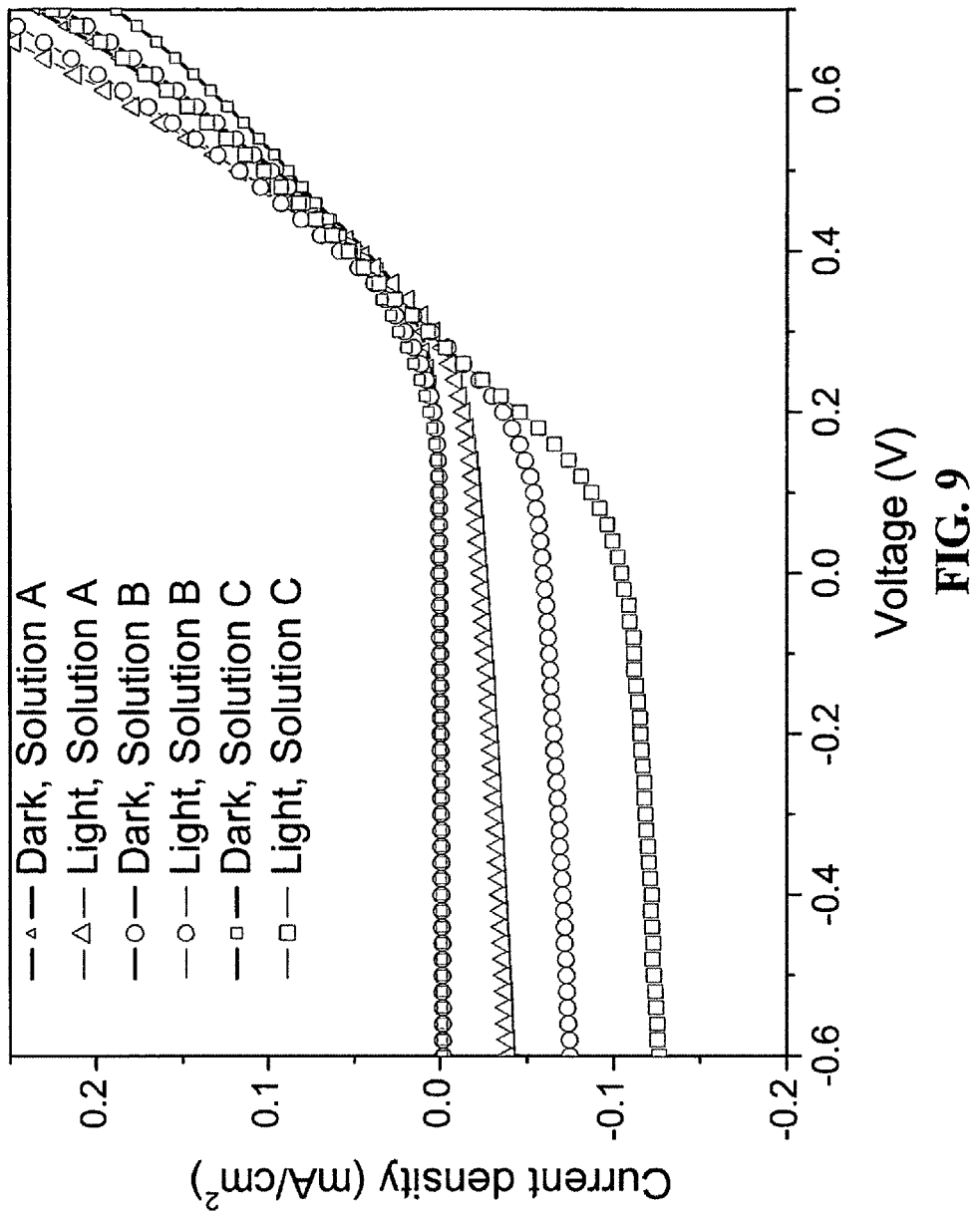
FIG. 9 shows plots of current density and voltage exhibited by a carbon-based photovoltaic cell for various SWNT concentrations, in accordance with one or more embodiments.

In some embodiments, carbon-based photovoltaic cells are formed using P3DDT/SWNT dispersions with ITO/PEDOT as the anode and Ag as the cathode. FIG. 9 shows plots of current density and voltage exhibited by such carbon-based photovoltaic cells for various SWNT concentrations, in accordance with one or more embodiments. PV performance of the carbon-based photovoltaic cells in this example is shown in Table 1. As shown therein, the short circuit current ($J_{sc}$) increases with increasing SWNT concentration. This increase is due to increased light absorption, and thus increased exciton generation, in the layers. The ratio between the current under illumination and in the dark (on/off ratio at 0V) increases from 480 to 3180 for the low concentration solution A (10 mg/25 mL toluene) to high concentration solution C (30 mg/25 ml toluene).

TABLE 1

| | NIR illumination | | | | | | AM 1.5 | |
| --- | --- | --- | --- | --- | --- | --- | --- | --- |
| Solution | Jsc (mA/cm2) | Voc (V) | FF | On/off@ 0 V | Average efficiency (%) | Max efficiency (%) | Average efficiency (%) | Max efficiency (%) |
| Solution A | −2.29E−02 | 0.28 | 0.403 | 480 | 5.62E−03 | 6.35E−03 | 2.28E−01 | 2.40E−01 |
| Solution B | −6.20E−02 | 0.29 | 0.436 | 1996 | 1.73E−02 | 2.04E−02 | 2.34E−01 | 2.38E−01 |
| Solution C | −1.13E−01 | 0.29 | 0.348 | 3180 | 2.54E−02 | 2.79E−02 | 1.80E−01 | 1.84E−01 |

In addition to increasing the SWNT concentration to vary the SWNT layer thickness, in various embodiments, overall absorption and performance of the carbon-based photovoltaic cells may be further increased by adjusting deposition conditions of the SWNT layer. For instance, to increase layer thickness, multiple layers may be spin-coated in addition to drop casting the films. In one particular implementation, good uniformity of the film may be achieved using a minimum spin-coating speed of 300 rpm for 90 s. After annealing these films to remove the solvent, the process may be repeated until film reaches the desired thickness. For instance, 1, 3, and 5-layer spin-coating may produce respective film thicknesses of 3, 4, and 5.5 nm.

Figure 10:
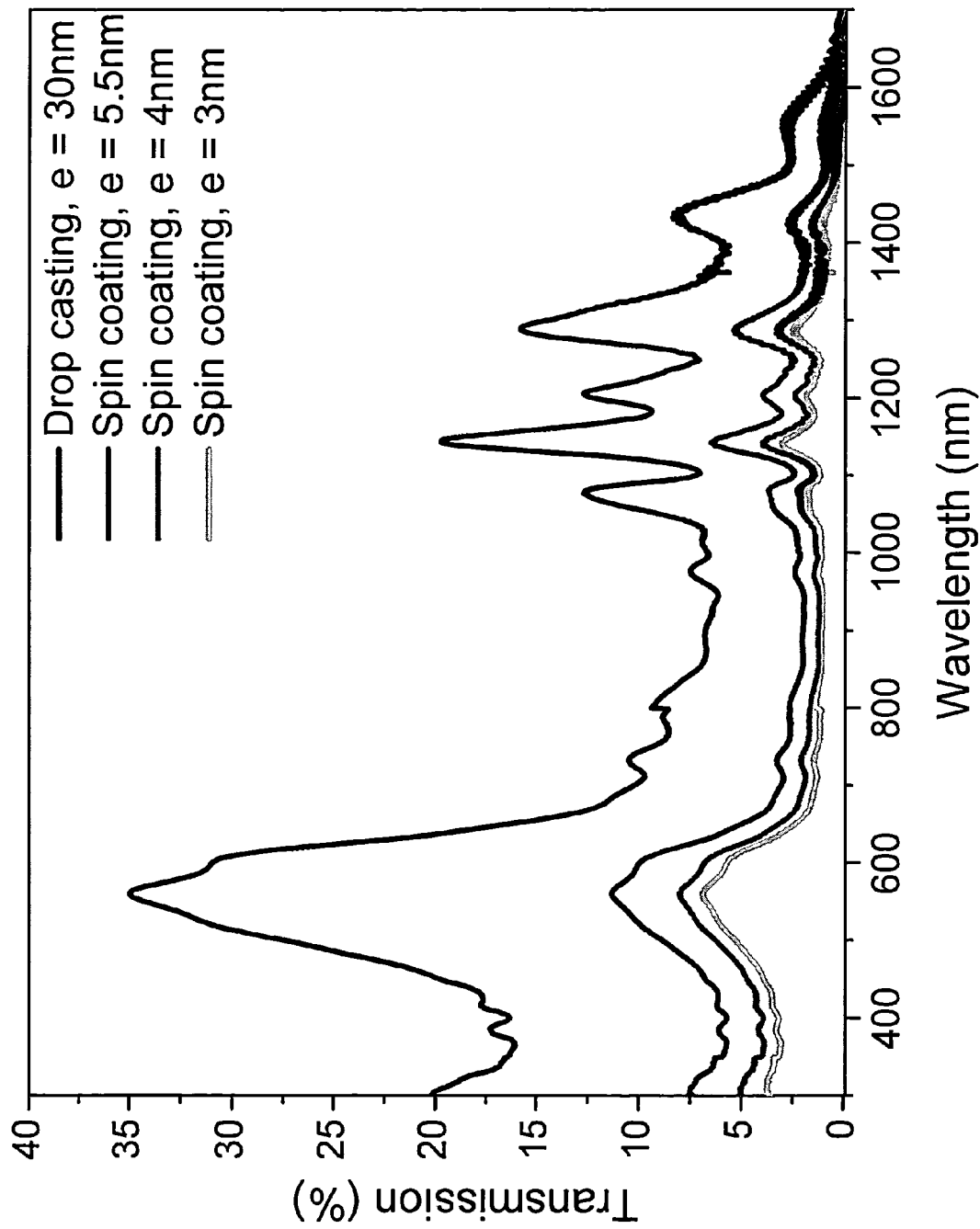
FIG. 10 shows plots of absorption spectra of SWNT films formed using various deposition conditions, in accordance with another example embodiment.

FIG. 10 shows plots of absorption spectra of four SWNT films formed using various deposition conditions, as may be implemented in connection with one or more example embodiments. In this example, the four SWNT films are formed using a 30 mg/25 ml toluene solution and different conditions of deposition. PV performance of the films is shown in Table 2. As shown in Table 2, the $J_{sc}$ and the efficiency increase as the SWNT layer thickness is increased and more light is absorbed. In this example, the drop casted films were much thicker (ca. 25-100 nm) but showed less improvement in $J_{sc}$ in comparison to spin-coated layers. However, less improvement in $J_{sc}$ is exhibited in the spin-coated films as the number of layers is increased beyond five layers.

Figure 11:
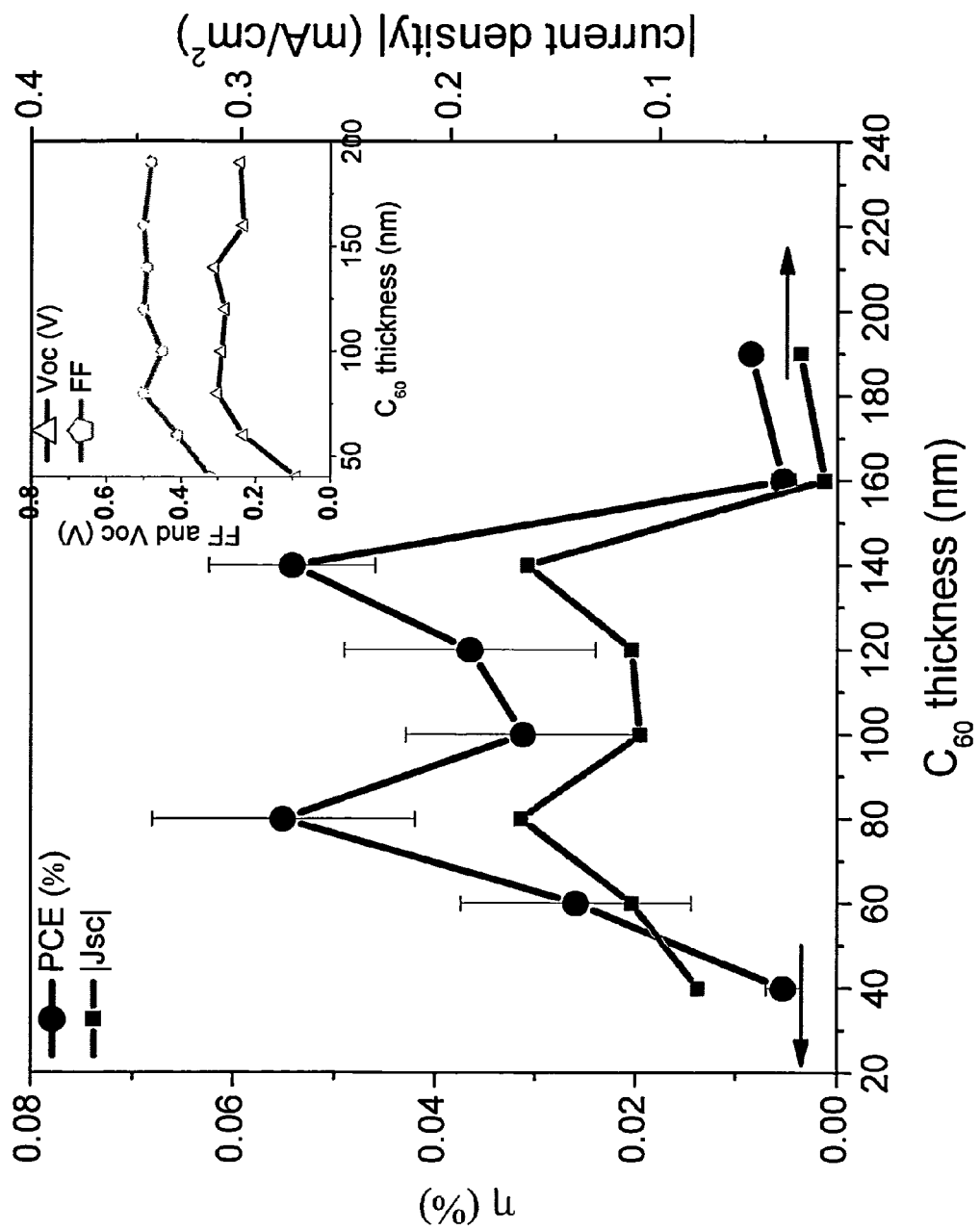
FIG. 11 illustrates performance of a carbon-based photovoltaic cell for different thicknesses of the C60 acceptor layer, in accordance with one or more embodiments.

FIG. 11 shows performance of different carbon-based photovoltaic cells in accordance with one or more embodiments, with a metallic-type cathode and having C60 layer thicknesses ranging from 40 nm to 190 nm. As shown in FIG. 11, $V_{oc}$ and FF are improved as thickness of the C60 layer is increased. As shown in FIG. 11, the PCE and current density are higher for C60 layer thicknesses of 80 nm and 140 nm. In some embodiments, constructive interference of a cavity effect formed by the Ag cathode is used as a mirror for the incoming light that is not absorbed by the active layer. For C60 thickness higher than 160 nm, the current density, and therefore the PCE, may be decreased due to resistive loses during the transport of electrons in the C60 layer.

Figure 12:
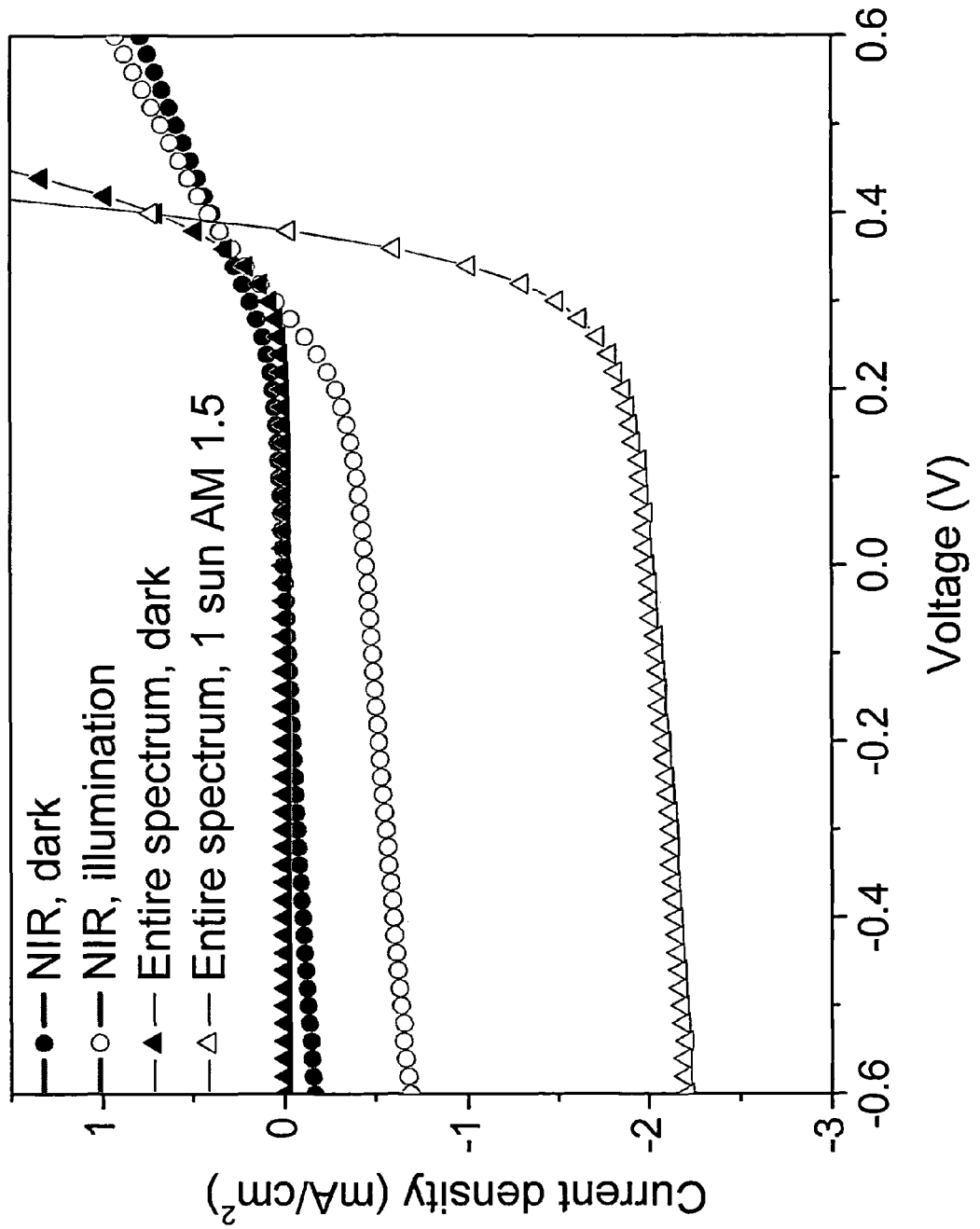
FIGS. 12 and 13 show performance and external quantum efficiency at various illumination intensities for a carbon-based photovoltaic cell, in accordance with another example embodiment.
Figure 13:
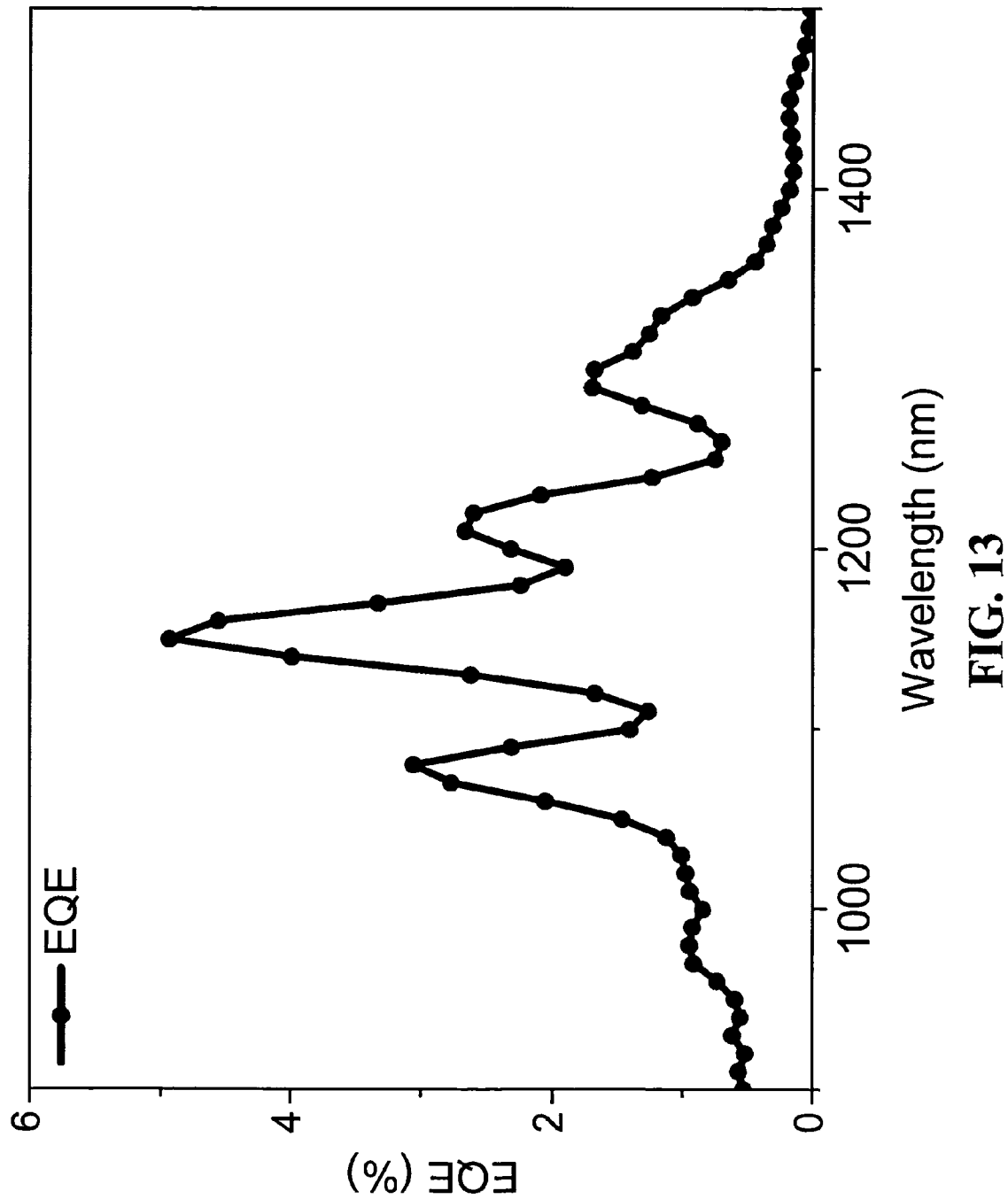

FIGS. 12 and 13 show performance and external quantum efficiency (EQE) for a carbon-based photovoltaic cell having both SWNT and C60 layer thickness configured for increased performance, as may be implemented with one or more embodiments. In this example the anode is ITO/PEDOT and the cathode is anode benzocyclobutene (BCB)/Ag. FIG. 12 shows I-V characteristic of the devices measured under standard illumination AM 1.5 (dark lines) with a full spectrum, and under near-IR illumination (grey lines) which show power conversion efficiency of 0.46% and 0.13% respectively. FIG. 13 shows the EQE as a function of wavelength in the near-IR region.

TABLE 2

| | NIR illumination | | | | | | AM 1.5 | |
| --- | --- | --- | --- | --- | --- | --- | --- | --- |
| Deposition/ thickness | Jsc (mA/cm2) | Voc (V) | FF | On/off @ 0 V | Average efficiency (%) | Max efficiency (%) | Average efficiency (%) | Max efficiency (%) |
| Spin coat 1X/ 3 nm | −9.92E−02 | 0.30 | 0.43 | 2385 | 2.85E−03 | 3.82E−2 | 0.184 | 0.191 |
| Spin coat 3X/ 4 nm | −1.29E−01 | 0.31 | 0.41 | 2707 | 3.65E−2 | 3.82E−2 | 0.174 | 0.177 |
| Spin coat 5X/ 5.5 nm | −1.48E−01 | 0.30 | 0.40 | 3054 | 4.00E−2 | 4.32E−2 | 0.1748 | 0.179 |
| Drop cast/ [25-100] nm | −1.41E−01 | 0.30 | 0.39 | 18910 | 3.56E−2 | 4.24E−2 | 0.125 | 0.140 |

In various embodiments, the thickness of C60 acceptor layers (e.g., on which SWNT films are deposited) is adjusted to set performance and/or other operational characteristics of the carbon-based photovoltaic cells. FIG. 11 illustrates performance of a carbon-based photovoltaic cell for different thicknesses of the C60 acceptor layer. The larger plot shows the power conversion efficiency (with the standard deviation) and the absolute value of the short circuit current as a function of C60 thickness. The smaller plot shows the Voc and FF as a function of C60 thickness. In this example, the C60 acceptor layer of the carbon-based photovoltaic cell is an n-type layer deposited via vacuum thermal evaporation (e.g., under vacuum (5×10$^{-5}$ Torr) at 0.05 nm/s).

As shown in FIG. 12, the carbon-based photovoltaic cell has a maximum PCE of 0.13% in the NIR (incoming light filtered below 800 nm) and 0.46% for AM1.5 Sun 100 mW/cm$^2$ illumination, respectively. As shown in FIG. 13, the carbon-based photovoltaic cell has a maximum EQE of 5% at 1150 nm.

In some embodiments, a carbon-based photovoltaic cell is configured to form a type-II heterojunction due to the P3DDT/SWNT interaction. The type-II heterojunction is defined as the heterojunction formed due to the interaction between the holes in the valence band of the SWNT and the highest occupied molecular orbital (HOMO) of the P3DDT, which can have an impact on the exciton dissociation process.

As indicated above, a carbon-based photovoltaic cell may be constructed using an ITO anode and an Ag cathode. However, the indium-containing ITO is both brittle and expensive. In one or more embodiments, a carbon-based photovoltaic cell includes carbon electrodes in lieu of the ITO anode and the Ag cathode discussed above. For instance, in one embodiment carbon-based photovoltaic cell is formed entirely of carbon-based materials, using reduced graphene oxide (rGO) and n-doped SWNTs. However, other materials may be used to form the anode and cathode including, e.g., CNTs, silver and copper nanowires, patterned metal grids, and organic polymers (PEDOT).

Various materials may be used to form the anode and cathode of the carbon-based photovoltaic cells. In some embodiments, materials may be selected to improve flexibility of the carbon-based photovoltaic cell. For instance, in one embodiment a stretchable organic photovoltaic cell is formed using PEDOT on a buckled polydimethylsiloxane (PDMS) substrate as the anode and EGaIn as the cathode. In another embodiment, flexible and stretchable graphene and carbon nanotube electrodes may be used in the carbon based photovoltaic cell.

In some embodiments, materials may be selected to improve flexibility as well as overall transparency of the carbon-based photovoltaic cell. For instance, in one embodiment, a carbon-based photovoltaic cell is formed using rGO as the anode and n-type doped SWNTs as the cathode. For general information regarding fabrication of the rGO anodes, and for specific examples as may be implemented in connection with one or more embodiments, reference may be made to Liang, X. et al.,"*Toward Clean and Crackless Transfer of Graphene,*" ACS Nano 2011, 5, (11), 9144-9153, which is fully incorporated herein by reference. Due to the smoothness of graphene films, use of the graphene to form electrodes was chosen (instead of CNTs) helps to reduce the amount of leakage and the possibility of shorting in the photovoltaic cell. Leakage and the possibility of shorting are also reduced by the use of rGO films for the anode instead of transferred CVD films of graphene. Although the rGO films are less conductive (and less transparent) than transferred CVD films, the resulting devices are better performing due to the smoothness of the films.

RGO anodes are fabricated using a number of different fabrication methods, in accordance with various embodiments. In one implementation, an rGO anode is fabricated using commercially available graphene oxide (GO). The GO is bath sonicated in water for 3 hours at 60° C., followed by centrifugation for 30 min at 14,000 rpm to remove the undispersed GO. The top 75% of the solution is decanted and spin-coated on quartz slides (2.0×2.5 cm) at 1000 rpm for 1 min. The substrates are then annealed on a hot plate at 100 C for 1 hour. The dried substrates are placed in a quartz boat with one end closed. The tube is placed into a split hinge oven and the open end was fitted to a turbo-pump vacuum line. The oven is heated to 100° C. at ambient pressure; then, the turbo pump is switched on, and a vacuum of $10^{-4}$ Torr is established before increasing the temperature to 1100° C. at a rate of 20° C. The temperature is held constant for 3 hours, after which the oven is allowed to cool for 3 hours before removing rGO film.

Figure 14:
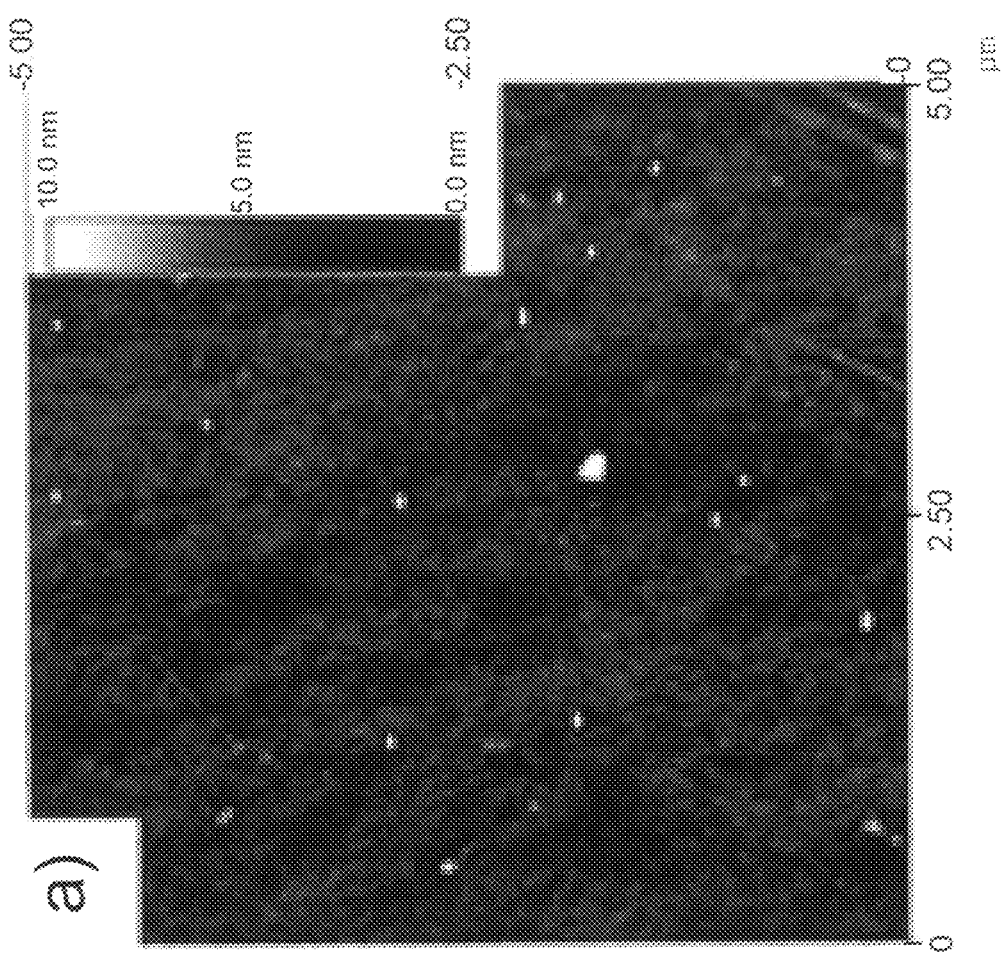
FIGS. 14 and 15 show respective AFM images of a graphene film before and after ozone treatment in accordance with one or more example embodiments.
Figure 15:
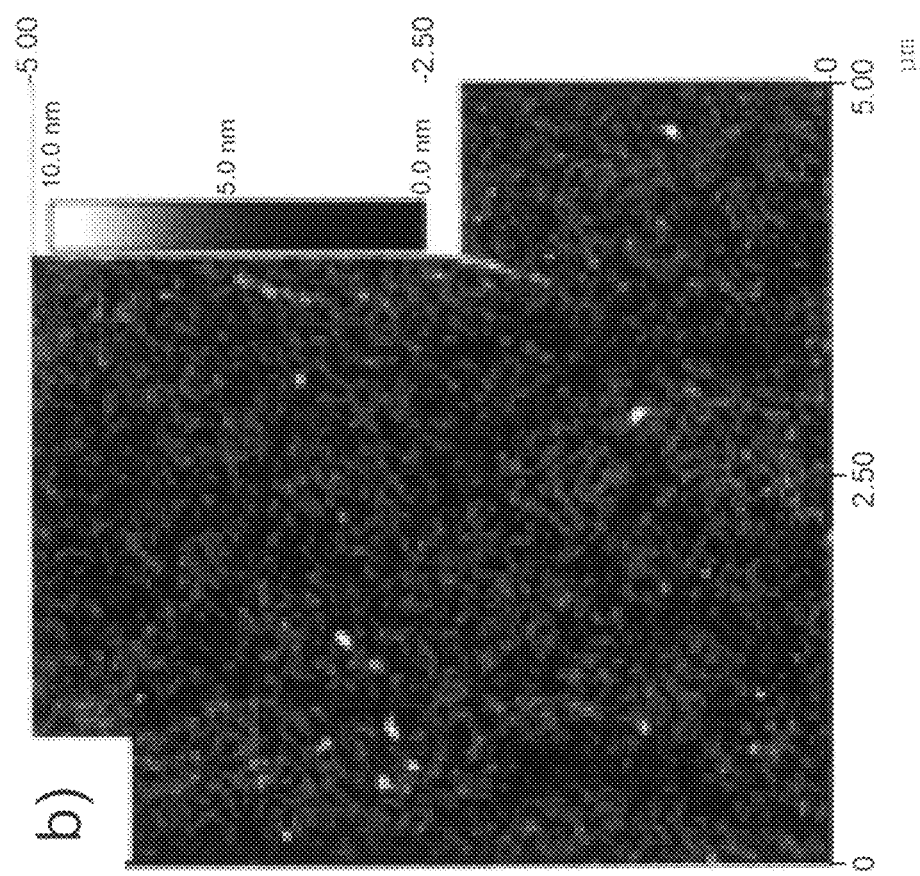

In some implementations, the work-function of the rGO films may be further increased by treating the films to short periods of $O_2$ plasma (5-10 seconds). It has been discovered, in connection with these embodiments, that this treatment can be used to increase work function of the films from 4.9 eV to 5.3 eV. FIGS. 14 and 15 show respective AFM images of a graphene film before and after such $O_2$ treatment. The AFM images were taken using tapping mode (light tapping regime) using a Multimode AFM. Solar spectrum measurements were taken with a solar simulator with a flux of 100 mW/cm$^2$ that approximated the solar spectrum under AM 1.5G conditions. A filter was applied to cut light bellow 800 nm for near-IR measurements. After the $O_2$ plasma treatment, the SWNT/P3DDT and C60 layers were deposited in the same manner as described above.

To evaluate the effectiveness of the rGO electrode, carbon-based photovoltaic cells were fabricated with an rGO anode and a standard Ag Cathode. In addition to rGO anodes with plasma, devices were fabricated with an additional PEDOT smoothening layer. The PV performances for these photovoltaic cells are summarized in Table 3. As can be seen in Table 3, the photovoltaic cells with rGO anode and Ag cathode resulted in decreased $V_{oc}$ and FF compared to the ITO/PEDOT anode, with an associated decrease in the PCE. One photovoltaic cell with this structure had a PCE of 0.12% for AM1.5 Sun illumination. In addition, the device-to-device variation was greater. In some embodiments, roughness of the rGO is adjusted during fabrication to increase performance. For instance, the rGO layer of a photovoltaic cell may be planarized and/or additional PEDOT smoothening layer may be added to further improve performance. Additionally, the high sheet resistance of the evaluated films (2-4 kΩ/☐ at about 85% transparency in the visible) resulted in lower device performance due to resistive loss during charge collection.

TABLE 3

| | NIR illumination | | | | | | AM 1.5 | | | | | |
|---|---|---|---|---|---|---|---|---|---|---|---|---|
| Anode - cathode | Jsc (mA/cm2) | Voc (V) | FF | On/off @ 0 V | Average efficiency (%) | Max efficiency (%) | Jsc (mA/cm2) | Voc (V) | FF | On/off @ 0 V | Average efficiency (%) | Max efficiency (%) |
| rGO/plasma - Ag | −2.84E−02 | 0.25 | 0.52 | 1.73E+03 | 8.16E−03 | 8.16E−03 | −9.19E−01 | 0.25 | 0.52 | 5.61E+04 | 1.41E−01 | 1.41E−01 |
| rGO/PEDOT - Ag | −4.51E−02 | 0.26 | 0.50 | 1.04E+03 | 1.31E−02 | 2.01E−02 | −1.31E+00 | 0.34 | 0.53 | 2.97E+04 | 2.36E−01 | 2.69E−01 |
| ITO-n-doped SWNTs | −2.79E−01 | 0.08 | 0.25 | 2.98E+01 | 1.29E−02 | 1.46E−02 | −4.37E+00 | 0.37 | 0.25 | 2.94E+02 | 2.49E−01 | 3.04E−01 |
| rGO/plasma - n-doped SWNTs | −3.00E−02 | 0.18 | 0.28 | 1.61E+03 | 3.42E−03 | 4.10E−03 | −7.98E−02 | 0.24 | 0.245 | 4.07E+03 | 4.71E−03 | 5.67E−03 |

In one implementation, the SWNT films for cathodes are fabricated by spray coating a solution of SWNTs (⅓ metallic) dispersed in N-Methyl-2-pyrrolidone (NMP) on polydimethylsiloxane (PDMS) substrates.

SWNT films are fabricated using a number of different fabrication methods, in accordance with various embodiments. For instance, in one implementation, commercially available HiPCO SWNTs and P3DDT at varying concentrations are sonicated in toluene, in an acetone bath, using a tip-sonicator at 70% power for 1 hour. The solution is then centrifuged for 1.5 hours at 17,000 rpm to remove the SWNT bundles, un-dispersed carbon and other contaminants. The resulting upper 75% of the resulting solution in the centrifugation tube is decanted and spin-coated on the desired anode using the following conditions: 0 rpm for 1 min, 300 rpm for 1 min, and 1200 rpm for 10 sec. The substrates are then annealed on a hot plate at 100° C. for 5 minutes. These films are then doped n-type using the molecular n-type dopant (4-(1,3-dimethyl-2,3-dihydro-1H-benzoimidazol-2-yl)phenyl)dimethylamine (N-DMBI) to allow the films to be used as cathodes.

N-type doped SWNT films may be fabricated using a number of different fabrication methods. For instance, in one implementation, an n-Type doped SWNT Cathode Fabrication may be manufactured using commercially available arc-discharged SWNTs. The SWNTs are sonicated in NMP, in an ice water bath, using a tip-sonicator at 30% power for 30 min. The solution is then centrifuged for 45 min at 8,000 rpm to remove large bundles and other contaminants. The upper 75% of the resulting solution is decanted and spray coated (using, e.g., a commercial airbrush) on PDMS substrates. The substrates are first activated with UV-ozone for 15 min, then held at 180° C. on a hotplate while the nanotubes are sprayed at a distance of about 10 cm using an airbrush pressure of 35 psi. The substrates are made, e.g., by puddle-casting a mixed and degassed PDMS prepolymer against the polished surface of a silicon wafer followed by curing at 60° C. for at least 30 min. Once the substrates are cooled down to room temperature, they are transferred to a $N_2$-filled glovebox to be doped by the n-type dopant. The various concentrations of N-DMBI in ethanol solutions are spin-coated onto the substrates with the same volume (80 μL) inside the glovebox. After doping, resulting films are laminated on top of C60 layer (e.g., using alligator clips) to form the n-type doped SWNT Cathode.

Figure 16:
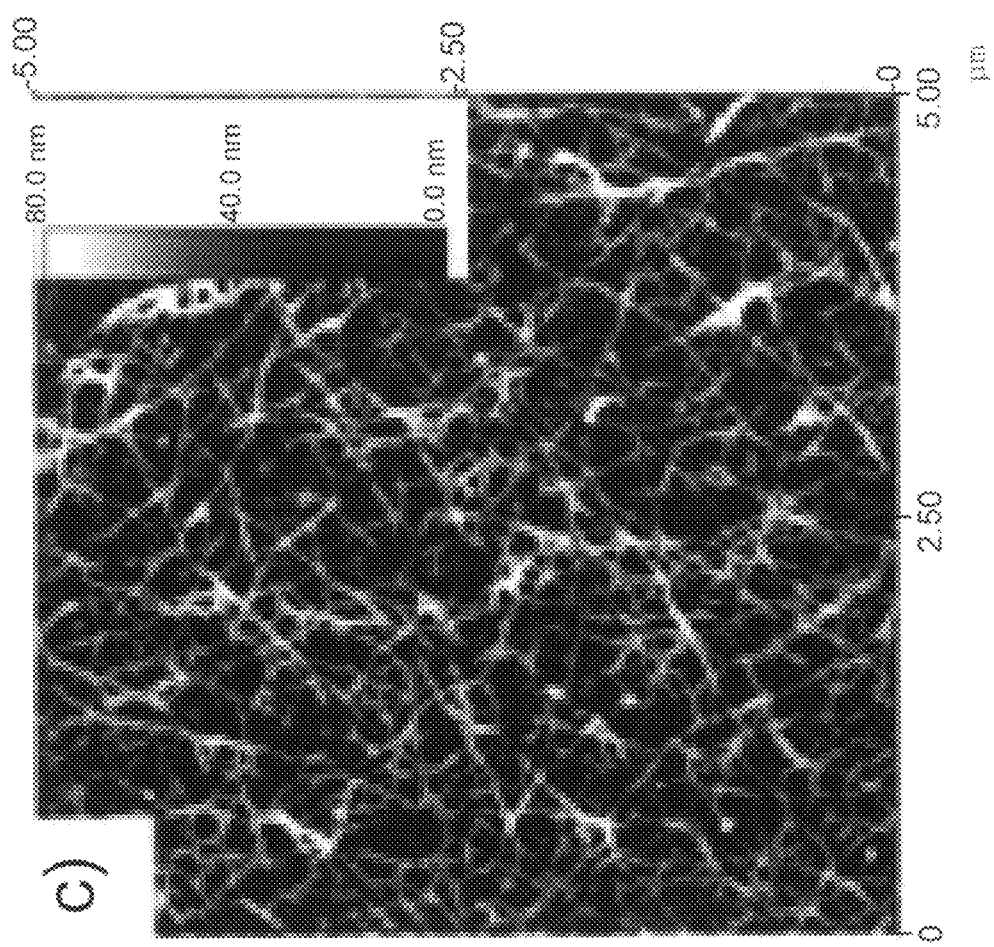
FIGS. 16 and 17 show respective AFM images of a spray coated SWNT film before and after n-type doping, in accordance with one or more example embodiments.
Figure 17:
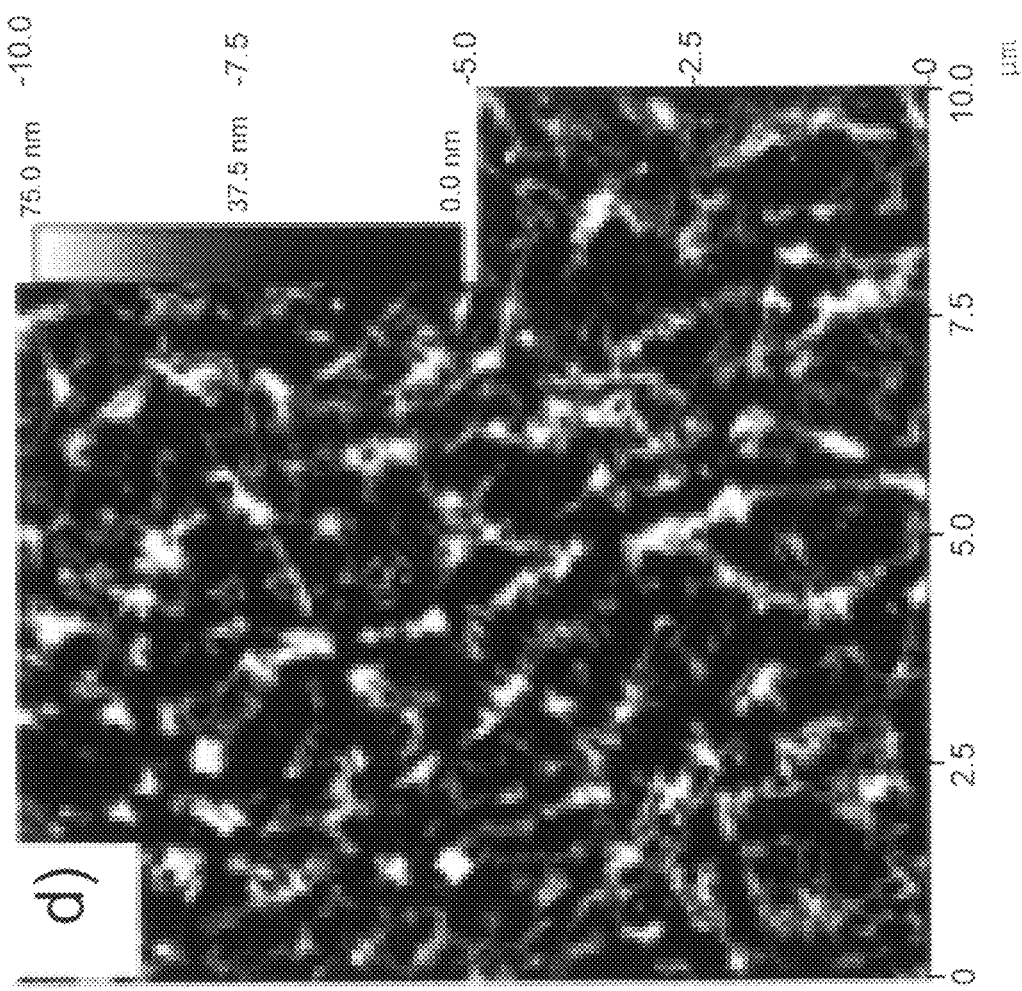

FIGS. 16 and 17 show respective AFM images of a spray coated SWNT film before and after n-type doping. After doping, the sheet resistance of these films is 200-300 Ω/☐ (70-80% Transmittance in the visible). The work function (measured by ultraviolet photoemission spectroscopy (UPS)) was between −3.4 to −4.24 eV depending on the amount of dopants applied, making them suitable as the cathode material. After completion, these films were laminated on the rGO/SWNT:P3DDT/C60 layers by pressing the films together.

The embodiments and specific applications discussed herein may be implemented in connection with one or more of the above-described aspects, embodiments and implementations, as well as with those shown in the above-referenced provisional patent document, the references cited therein and the Appendix that forms part of that document. This underlying provisional patent document, including the cited references and Appendix therein, are fully incorporated herein by reference.

While the present disclosure is amenable to various modifications and alternative forms, specifics thereof have been shown by way of example in the drawings and will be described in further detail. It should be understood that the intention is not to limit the disclosure to the particular embodiments and/or applications described. For example, illumination for photovoltaic applications may occur via anode, cathode, directly to a bilayer or heterojunction-type structure, or a combination of these (e.g., as shown in FIG. 1). Accordingly, the intention is to cover all modifications, equivalents, and alternatives falling within the spirit and scope of the present disclosure.

What is claimed is:

1. An apparatus comprising:
   a carbon-based semiconductor material including n-type and p-type materials that form a p-n junction; and
   first and second electrodes including a carbon allotrope, the first electrode being connected to the n-type material and the second electrode being connected to the p-type material, the electrodes being configured and arranged to collect charge generated at the p-n junction, wherein the carbon-based semiconductor material is arranged between the first and second electrodes, the p-n junction is configured and arranged to exhibit a photovoltaic effect, and at least one of the electrodes is configured and arranged to pass light to the carbon-based semiconductor material for generating the charges; and wherein the carbon-based semiconductor material includes p-type semiconducting carbon nanotubes and at least one of n-type C60 material and n-type C70 material.

2. The apparatus of claim 1, wherein the first electrode includes carbon nanotubes doped with an n-type dopant, and the second electrode includes ozone-plasma-treated reduced graphene oxide.

3. The apparatus of claim 1, wherein the carbon-based semiconductor material is stacked vertically between the first and second electrodes.

4. An apparatus comprising:
   a carbon-based semiconductor material including n-type and p-type materials that form a p-n junction; and
   first and second electrodes including a carbon allotrope, the first electrode being connected to the n-type material and the second electrode being connected to the p-type material, the electrodes being configured and arranged to collect charge generated at the p-n junction, wherein the carbon-based semiconductor material is stacked vertically between the first and second electrodes, the p-n junction is configured and arranged to exhibit a photovoltaic effect, and at least one of the electrodes is configured and arranged to pass light to the carbon-based semiconductor material for generating the charges; and wherein the carbon-based semiconductor material includes p type semiconducting carbon nanotubes and at least one of n-type C60 material and n-type C70 material.

5. The apparatus of claim 1, wherein the first electrode includes carbon nanotubes doped with an n-type dopant, and the second electrode includes a reduced graphene oxide sheet.

6. The apparatus of claim 1, wherein the first electrode includes at least one of doped carbon nanotubes, doped graphene and doped C60.

7. The apparatus of claim 1, wherein the second electrode includes at least one of graphene and conductive carbon nanotubes.

8. The apparatus of claim 1, wherein the first electrode includes carbon nanotubes, and the second electrode includes reduced graphene oxide.

9. The apparatus of claim 1, wherein the first electrode includes carbon nanotubes doped with an n-type dopant.

10. The apparatus of claim 1, wherein the second electrode includes reduced graphene oxide.

11. The apparatus of claim 1, wherein the second electrode includes ozone-plasma-treated reduced graphene oxide.

12. The apparatus of claim 1, wherein the second electrode includes conductive carbon nanotubes.

13. The apparatus of claim 1, wherein the carbon-based semiconductor material is configured to generate the charge by dissociating excitons generated at the p-n junction in response to light incident upon the carbon-based semiconductor material.

14. The apparatus of claim 1, wherein the carbon-based semiconductor material and the electrodes consist of a carbon-based material.

15. An apparatus comprising:
a carbon-based semiconductor material including n-type and p-type materials that form a p-n junction; and
first and second electrodes including a carbon allotrope, the first electrode being connected to the n-type material and the second electrode being connected to the p-type material, the electrodes being configured and arranged to collect charge generated at the p-n junction, wherein the carbon-based semiconductor material includes a plurality of single-walled carbon nanotubes including first and second types of nanotubes having different light absorption characteristics, the first type of nanotubes being configured and arranged to absorb more light energy than the second type of nanotubes under a first light condition, and the second type of nanotubes being configured and arranged to absorb more light energy than the first type of nanotubes under a second light condition that is different than the first light condition.

16. A photovoltaic apparatus comprising:
an anode having an ozone-plasma-treated reduced graphene oxide sheet;
a cathode having n-doped carbon nanotubes; and
a carbon-based semiconductor material separating the anode and cathode and including an n-type material including n-type fullerene connected to the cathode, and a p-type material including p-type semiconducting carbon nanotubes, the n-type material and p-type material a forming p-n junction configured and arranged to generate charge via a photovoltaic effect in response to light passed via one of the anode and cathode, the anode and cathode being configured and arranged to pass the generated charge.

17. The apparatus of claim 16, wherein the ozone-plasma-treated reduced graphene oxide sheet is configured and arranged to facilitate a work-function increase in the apparatus of at least 5%, relative to such a reduced graphene oxide sheet not exhibiting ozone-plasma-treatment characteristics.

18. A method comprising:
forming a first electrode including a carbon allotrope;
forming a carbon-based semiconductor material including n-type and p-type materials that form a p-n junction that exhibits a photovoltaic effect, the n-type material being connected to the first electrode; and
forming a second electrode including a carbon allotrope connected to the p-type material, the first and second electrodes being configured and arranged to collect charge generated at the p-n junction, wherein the carbon-based semiconductor material is arranged between the first and second electrodes, the p-n junction is configured and arranged to exhibit a photovoltaic effect, and at least one of the electrodes is configured and arranged to pass light to the carbon-based semiconductor material for generating the charges; and wherein the carbon-based semiconductor material includes p-type semiconducting carbon nanotubes and at least one of n-type C60 material and n-type C70 material.

19. The method of claim 18, wherein forming the first electrode includes forming an anode by treating a reduced graphene oxide sheet with ozone-plasma.

20. The method of claim 19, wherein treating the reduced graphene oxide sheet with ozone-plasma includes increasing a work-function of the reduced graphene oxide sheet by treating the reduced graphene oxide sheet with ozone-plasma during multiple periods of time between which the reduced graphene oxide sheet is not treated with the ozone-plasma.

21. The method of claim 18, wherein forming the carbon-based semiconductor material includes forming p-type semiconducting carbon nanotubes on the first electrode and forming n-type fullerene on the p-type material to form the p-n junction.

22. The method of claim 18, wherein forming the second electrode includes forming a cathode having n-doped carbon nanotubes on the n-type material.

23. The method of claim 18, wherein forming the second electrode includes spray-coating a solution of single-walled carbon nanotubes on a substrate and doping the single-walled carbon nanotubes using a molecular n-type dopant.

24. A method comprising:
forming a first electrode including a carbon allotrope;
forming a carbon-based semiconductor material including n-type and p-type materials that form a p-n junction that exhibits a photovoltaic effect, the n-type material being connected to the first electrode; and
forming a second electrode including a carbon allotrope connected to the p-type material, the first and second electrodes being configured and arranged to collect charge generated at the p-n junction, wherein forming the carbon-based semiconductor material includes forming first and second types of nanotubes having different light absorption characteristics, the first type of nanotubes being configured and arranged to absorb more light energy than the second type of nanotubes under a first light condition, and the second type of nanotubes being configured and arranged to absorb more light energy than the first type of nanotubes under a second light condition that is different than the first light condition.

25. The method of claim 18, wherein at least one of the first and second electrodes is characterized as being processed to exhibit a work function that is at least 5% greater than a work function thereof before being processed.

26. The method of claim 18, wherein one of the first and second electrodes includes carbon nanotubes doped with an n-type dopant to exhibit a work function that is at least 5% greater.

27. The apparatus of claim 1, wherein at least one of the first and second electrodes is characterized as being processed to exhibit a work function that is at least 5% greater than a work function thereof before being processed.

28. The apparatus of claim 1, wherein at least one of the first and second electrodes is characterized as being doped with an n-type dopant to exhibit a work function that is at least 5% greater than a work function thereof before being processed.

* * * * *

UNITED STATES PATENT AND TRADEMARK OFFICE
CERTIFICATE OF CORRECTION

| | |
|---|---|
| PATENT NO. | : 8,866,265 B2 |
| APPLICATION NO. | : 13/573726 |
| DATED | : October 21, 2014 |
| INVENTOR(S) | : Bao et al. |

Page 1 of 1

It is certified that error appears in the above-identified patent and that said Letters Patent is hereby corrected as shown below:

In the Claims

Col. 15, line 35, Claim 16: "p-type material a forming p-n junction" should read --p-type material forming a p-n junction--.

Signed and Sealed this
Twenty-ninth Day of December, 2015

Michelle K. Lee
*Director of the United States Patent and Trademark Office*